United States Patent
Paak et al.

(10) Patent No.: US 9,576,613 B2
(45) Date of Patent: Feb. 21, 2017

(54) SEMICONDUCTOR DEVICE

(71) Applicant: Samsung Electronics Co., Ltd., Suwon-si (KR)

(72) Inventors: Steve Sunhom Paak, Seoul (KR); Kangwook Park, Seoul (KR); Heonjong Shin, Yongin-si (KR); Sunil Yu, Seongnam-si (KR); Jongmil Youn, Yongin-si (KR); Hyungsoon Jang, Hwaseong-si (KR)

(73) Assignee: SAMSUNG ELECTRONICS CO., LTD., Samsung-ro, Yeongtong-gu, Suwon-si, Gyeonggi-do (KR)

( * ) Notice: Subject to any disclaimer, the term of this patent is extended or adjusted under 35 U.S.C. 154(b) by 59 days.

(21) Appl. No.: 14/571,634

(22) Filed: Dec. 16, 2014

(65) Prior Publication Data

US 2015/0255123 A1    Sep. 10, 2015

(30) Foreign Application Priority Data

Mar. 7, 2014 (KR) .................. 10-2014-0027239

(51) Int. Cl.
| | |
|---|---|
| G11C 5/02 | (2006.01) |
| G11C 5/06 | (2006.01) |
| G11C 8/14 | (2006.01) |
| G11C 29/12 | (2006.01) |
| G11C 29/48 | (2006.01) |
| G11C 29/56 | (2006.01) |

(52) U.S. Cl.
CPC . *G11C 5/06* (2013.01); *G11C 5/02* (2013.01); *G11C 8/14* (2013.01); *G11C 29/1201* (2013.01); *G11C 29/48* (2013.01); *G11C 5/025* (2013.01); *G11C 2029/5602* (2013.01)

(58) Field of Classification Search
CPC .............. G11C 5/06; G11C 5/02; G11C 8/14; G11C 29/1201; G11C 29/48
USPC ............................................. 365/51, 63, 72
See application file for complete search history.

(56) References Cited

U.S. PATENT DOCUMENTS 6,028,442 A * 2/2000 Lee .................. G09G 3/006
                                            324/537
6,037,794 A * 3/2000 Yamamoto ......... G01R 31/2886
                                            324/750.08

(Continued)

FOREIGN PATENT DOCUMENTS

| JP | 2000-286316 A | 10/2000 |
|---|---|---|
| JP | 2010-287769 A | 12/2010 |

(Continued)

*Primary Examiner* — Viet Q Nguyen
(74) *Attorney, Agent, or Firm* — Muir Patent Law, PLLC

(57) ABSTRACT

A semiconductor device may include a semiconductor substrate; a test circuit array region; a pad region on the semiconductor substrate and at at least a first side of the test circuit array region and outside of the test circuit array region, transistors arranged in the test circuit array region in a first direction and a second direction perpendicular to the first direction, source lines spaced apart from each other in the second direction, each of the source lines extending in the first direction and electrically connected to corresponding source electrodes of the transistors, and drain lines spaced apart from each other in the second direction, each of the drain lines extending in the first direction and electrically connected to drain electrodes of the transistors.

13 Claims, 20 Drawing Sheets

(56) References Cited

U.S. PATENT DOCUMENTS

| | | | |
|---|---|---|---|
| 6,063,640 A * | 5/2000 | Mizukoshi | H01L 22/22 438/15 |
| 6,795,952 B1 | 9/2004 | Stine et al. | |
| 6,806,494 B2 | 10/2004 | Fenner et al. | |
| 6,881,597 B2 | 4/2005 | Asayama et al. | |
| 7,312,625 B1 | 12/2007 | Paak et al. | |
| 7,468,283 B2 | 12/2008 | Kwon | |
| 7,821,287 B2 * | 10/2010 | Chen | G09G 3/006 324/760.02 |
| 7,956,976 B1 * | 6/2011 | Hayata | G09G 3/006 349/149 |
| 8,021,712 B2 | 9/2011 | Nakazawa et al. | |
| 8,198,627 B2 * | 6/2012 | Jeong | G01R 31/2884 257/48 |
| 2002/0063251 A1 * | 5/2002 | Sugiura | H01L 22/32 257/48 |
| 2004/0125307 A1 * | 7/2004 | Lee | G02F 1/1362 349/149 |
| 2004/0188763 A1 * | 9/2004 | Taniguchi | H01L 22/32 257/355 |
| 2006/0221296 A1 * | 10/2006 | Fujita | G02F 1/133351 349/187 |
| 2008/0123005 A1 * | 5/2008 | Sohn | G02F 1/1309 349/40 |
| 2008/0203577 A1 * | 8/2008 | Fukamizu | H01L 24/05 257/773 |
| 2008/0251787 A1 * | 10/2008 | Kim | H01L 22/32 257/48 |
| 2008/0308798 A1 * | 12/2008 | Komatsu | G01R 31/2884 257/48 |
| 2009/0243645 A1 * | 10/2009 | Shinkawata | G01R 31/2884 324/750.16 |
| 2009/0273753 A1 * | 11/2009 | Park | G09G 3/006 349/152 |
| 2009/0322362 A1 * | 12/2009 | Lim | G01R 31/2884 324/762.06 |
| 2010/0013507 A1 * | 1/2010 | Tu | G09G 3/006 324/756.01 |
| 2010/0127258 A1 * | 5/2010 | Kang | G02F 1/13458 257/48 |
| 2010/0252828 A1 | 10/2010 | Grillberger et al. | |
| 2010/0295567 A1 * | 11/2010 | Chang | G01R 31/046 324/719 |
| 2013/0248863 A1 * | 9/2013 | Tang | H01L 22/30 257/48 |
| 2013/0335109 A1 * | 12/2013 | Chen | H01L 23/544 324/750.25 |
| 2014/0179032 A1 * | 6/2014 | Hasebe | H01L 22/14 438/15 |
| 2015/0107102 A1 * | 4/2015 | Lee | G01R 3/00 29/850 |
| 2015/0149940 A1 * | 5/2015 | Kaiser | G06F 19/3431 715/765 |
| 2016/0043010 A1 * | 2/2016 | Kwak | H01L 22/14 257/48 |

FOREIGN PATENT DOCUMENTS

| | | |
|---|---|---|
| KR | 10-2000-0051684 A | 8/2000 |
| KR | 10-0390939 B1 | 7/2003 |
| KR | 10-2004-0008396 A | 1/2004 |
| KR | 10-0539219 B1 | 12/2005 |
| KR | 10-0641471 B1 | 10/2006 |

* cited by examiner

SEMICONDUCTOR DEVICE

CROSS-REFERENCE TO RELATED APPLICATION

This U.S. non-provisional patent application claims priority under 35 U.S.C. §119 to Korean Patent Application No. 10-2014-0027239, filed on Mar. 7, 2014, in the Korean Intellectual Property Office, the disclosure of which is hereby incorporated by reference in its entirety.

BACKGROUND

The present disclosure relates to semiconductor devices, and more particularly, to semiconductor devices including test circuit arrays.

A plurality of integrated circuits may be formed on a wafer to manufacture a semiconductor device, such as a semiconductor chip. After the formation of the integrated circuits, electrical characteristics of the integrated circuits should be measured to confirm whether the semiconductor chip works properly or not. In general, it is important to precisely extract the electrical characteristics of the integrated circuits on the wafer as semiconductor devices have been highly integrated.

Accordingly, a semiconductor device, such as a device under test (DUT) may be manufactured on a wafer to assist evaluation and/or control of semiconductor manufacturing processes. Electrical characteristics of the wafer having the DUT may be tested by test equipment.

SUMMARY

Embodiments of the disclosure may provide semiconductor devices capable of effectively testing semiconductor processes and electrical characteristics of semiconductor devices.

According to one embodiment, a semiconductor device may include: a semiconductor substrate; a test circuit array region on the semiconductor substrate; a pad region on the semiconductor substrate and at at least a first side of the test circuit array region and outside of the test circuit array region; transistors arranged in the test circuit array region in a first direction and a second direction perpendicular to the first direction; source lines spaced apart from each other in the second direction, each of the source lines extending in the first direction and electrically connected to corresponding source electrodes of the transistors; and drain lines spaced apart from each other in the second direction, each of the drain lines extending in the first direction and electrically connected to corresponding drain electrodes of the transistors. Each of the source lines and the drain lines may include: a first interconnection portion having a first length in the first direction and a first width in the second direction less than the first length, the first interconnection portion disposed in the test circuit array region; and a first pad portion having a second length in the first direction and a second width in the second direction greater than the first width, the first pad portion disposed in the pad region. Different first pad portions of the source and drain lines may be disposed in the pad region at different distances from the first side of the test circuit array region.

In some embodiments, the semiconductor device may further include: word lines spaced apart from each other in the first direction, each of the word lines extending in the second direction and electrically connected to corresponding gate electrodes of the transistors. Each of the word lines may include: a second interconnection portion having a first length in the second direction and a first width in the first direction less than the first length of the second interconnection portion, the second interconnection portion disposed in the test circuit array region; and a second pad portion having a second length in the second direction and a second width in the first direction greater than the first width of the second interconnection portion, the second pad portion disposed in the pad region. Different second pad portions of the word lines may be disposed in the pad region at different distances from a second side of the test circuit array region perpendicular to the first side of the test circuit array region.

In some embodiments, the source lines and the drain lines may be disposed at a first height above a top surface of the semiconductor substrate, and the word lines may be disposed at a second height higher than the first height above the top surface of the semiconductor substrate.

In some embodiments, the semiconductor device may further include: well driving lines spaced apart from each other in the first direction. Each of the well driving lines extends in the second direction and is electrically connected to corresponding bodies of the transistors. Each of the well driving lines may include: a third interconnection portion having a first length in the second direction and a first width in the first direction less than the first length of the third interconnection portion, the third interconnection portion disposed in the test circuit array region; and a third pad portion having a second length in the second direction and a second width in the first direction greater than the first width of the third interconnection portion, the third pad portion disposed in the pad region. Different third pad portions of the well driving lines may be disposed in the pad region at different distances from a second side of the test circuit array region perpendicular to the first side of the test circuit array region.

In some embodiments, the transistors may include: a plurality of NMOS transistors arranged in the second direction; and a plurality of PMOS transistors connected in parallel to the NMOS transistors and arranged in the second direction and spaced apart from the plurality of NMOS transistors.

In some embodiments, the semiconductor device may further include a well dopant layer having a second conductivity type. The well dopant layer may be formed in the semiconductor substrate which has a first conductivity type different from the second conductivity type. The transistors may include: a plurality of active portions disposed in the semiconductor substrate and the well dopant layer; gate electrodes crossing the active portions; and source and drain electrodes formed in the active portions at respective opposite sides of each of the gate electrodes.

In some embodiments, the active portions may have different widths from each other in the first direction or the second direction.

In some embodiments, the semiconductor device may further include: a source decoder electrically connected to the source lines and configured to selectively apply a source voltage to the source lines; and a drain decoder electrically connected to the drain lines and configured to selectively apply a drain voltage to the drain lines.

According to another embodiment, a semiconductor device may include: transistors arranged on a semiconductor substrate along a first direction and a second direction perpendicular to the first direction; source lines each extending in the first direction and electrically connected to corresponding source electrodes of the transistors; word lines each extending in the first direction and electrically connected to corresponding gate electrodes of the transistors; and drain lines each extending in the first direction and electrically connected to corresponding drain electrodes of the transistors. Each of the source lines, the word lines and the drain lines may include: a first interconnection portion having a first length in the first direction and a first width in the second direction less than the first length; and a first pad portion having a second length in the first direction and a second width in the second direction greater than the first width. The source lines may be spaced apart from each other in the first direction, the word lines may be spaced apart from each other in the first direction, and the drain lines may be spaced apart from each other in the first direction. The first pad portions of the source lines, the word lines and the drain lines may be disposed between the interconnection portions adjacent to each other in the first direction when viewed from a plan view.

In some embodiments, the pad portions may be arranged in a third direction diagonal to the first and second directions when viewed from a plan view.

In some embodiments, a first group may include a first set of the source lines, the word lines, and the drain lines, and a second group may include a second set of the source lines, the word lines, and the drain lines. The first group and the second group may be point-symmetric with respect to a point of a symmetry axis extending a third direction diagonal to the first and second directions when viewed from a plan view.

In some embodiments, each of the word lines may be disposed between a source line and a drain line adjacent to each other.

In some embodiments, the source lines, the word lines, and the drain lines may be disposed at the same height above a top surface of the semiconductor substrate.

In some embodiments, the semiconductor device may further include: well driving lines each extending in the first direction and connected to corresponding bodies of the transistors. Each of the well driving lines may include: a second interconnection portion having a first length in the first direction and a first width in the second direction less than the first length of the second interconnection portion; and a second pad portion having a second length in the first direction and a second width in the second direction greater than the first width of the second interconnection portion.

In some embodiments, the transistors may include: a plurality of NMOS transistors arranged in the second direction; and a plurality of PMOS transistors connected in parallel to the NMOS transistors and arranged in the second direction and spaced apart from the plurality of NMOS transistors.

According to still another embodiment, a semiconductor device may include: a substrate; and one or more test circuits each including lines extending in a first direction and a second direction perpendicular to the first direction on the substrate. Each of the one or more test circuits may comprise: an array including a plurality of transistors arranged in the first and second directions; a first set of lines spaced apart from each other in the second direction, wherein each line of the first set of lines may extend in the first direction, include a first conductive line and a first pad disposed at one end of the first conductive line, and electrically connect to corresponding first sources/drains of the transistors; and a second set of lines spaced apart from each other in the second direction, wherein each line of the second set of lines may extend in the first direction, include a second conductive line and a second pad disposed at one end of the second conductive line, and electrically connect to corresponding second sources/drains of the transistors. A first set of pads of the first and second sets of lines may be arranged at a first side of the array outside the array and configured to be electrically connected to external terminals. Different pads of the first set of pads may be disposed at different distances from the first side of the array.

BRIEF DESCRIPTION OF THE DRAWINGS

Exemplary embodiments of the disclosure will become more apparent in view of the attached drawings and accompanying detailed description.

DETAILED DESCRIPTION OF THE EMBODIMENTS

Figure 1:
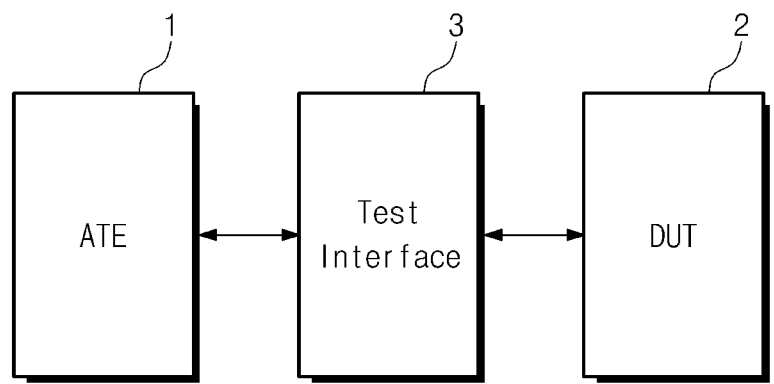
FIG. 1 is a schematic block diagram illustrating a test system for testing a semiconductor device according to example embodiments of the inventive concepts.

The present disclosure will now be described more fully hereinafter with reference to the accompanying drawings, in which exemplary embodiments of the inventive concepts are shown. The advantages and features of the inventive concepts and methods of achieving them will be apparent from the following exemplary embodiments that will be described in more detail with reference to the accompanying drawings. It should be noted, however, that the inventive concepts are not limited to the following exemplary embodiments, and may be implemented in various forms. Accordingly, the exemplary embodiments are provided only to disclose the inventive concepts and let those skilled in the art know the category of the inventive concepts. In the drawings, embodiments of the inventive concepts are not limited to the specific examples provided herein and are exaggerated for clarity.

The terminology used herein is for the purpose of describing particular embodiments only and is not intended to limit the invention. As used herein, the singular terms "a," "an" and "the" are intended to include the plural forms as well, unless the context clearly indicates otherwise. As used herein, the term "and/or" includes any and all combinations of one or more of the associated listed items. It will be understood that when an element is referred to as being "connected" or "coupled" to another element, it may be directly connected or coupled to the other element or intervening elements may be present.

Similarly, it will be understood that when an element such as a layer, region or substrate is referred to as being "on" another element, it can be directly on the other element or intervening elements may be present. In contrast, the term "directly" means that there are no intervening elements. The term "contact," as used herein, refers to a direct contact, unless indicated otherwise. It will be further understood that the terms "comprises," "comprising," "includes," and/or "including," when used herein, specify the presence of stated features, integers, steps, operations, elements, and/or components, but do not preclude the presence or addition of one or more other features, integers, steps, operations, elements, components, and/or groups thereof.

Additionally, the embodiments in the detailed description will be described with sectional views as ideal exemplary views of the inventive concepts. Accordingly, shapes of the exemplary views may be modified according to manufacturing techniques and/or allowable errors. Therefore, the embodiments of the inventive concepts are not limited to the specific shape illustrated in the exemplary views, but may include other shapes that may be created according to manufacturing processes. Areas exemplified in the drawings have general properties, and are used to illustrate specific shapes of elements. Thus, this should not be construed as limiting to the scope of the inventive concepts.

It will be also understood that although the terms first, second, third etc. may be used herein to describe various elements, these elements should not be limited by these terms. Unless indicated otherwise, these terms are only used to distinguish one element from another element. Thus, a first element in some embodiments could be termed a second element in other embodiments without departing from the teachings of the present invention. Exemplary embodiments of aspects of the present inventive concepts explained and illustrated herein include their complementary counterparts. The same reference numerals or the same reference designators denote the same or similar elements throughout the specification.

Moreover, exemplary embodiments are described herein with reference to cross-sectional illustrations and/or plane illustrations that are idealized exemplary illustrations. Accordingly, variations from the shapes of the illustrations as a result, for example, of manufacturing techniques and/or tolerances, are to be expected. Thus, exemplary embodiments should not be construed as limited to the shapes of regions illustrated herein but are to include deviations in shapes that result, for example, from manufacturing. For example, an etching region illustrated as a rectangle will, typically, have rounded or curved features. Thus, the regions illustrated in the figures are schematic in nature and their shapes are not intended to limit the scope of example embodiments.

As appreciated by the present inventive entity, devices and methods of forming devices according to various embodiments described herein may be embodied in microelectronic devices such as integrated circuits, wherein a plurality of devices according to various embodiments described herein are integrated in the same microelectronic device. Accordingly, the cross-sectional view(s) illustrated herein may be replicated in two different directions, which need not be orthogonal, in the microelectronic device. Thus, a plan view of the microelectronic device that embodies devices according to various embodiments described herein may include a plurality of the devices in an array and/or in a two-dimensional pattern that is based on the functionality of the microelectronic device.

The devices according to various embodiments described herein may be interspersed among other devices depending on the functionality of the microelectronic device. Moreover, microelectronic devices according to various embodiments described herein may be replicated in a third direction that may be orthogonal to the two different directions, to provide three-dimensional integrated circuits.

Accordingly, the cross-sectional view(s) illustrated herein provide support for a plurality of devices according to various embodiments described herein that extend along two different directions in a plan view and/or in three different directions in a perspective view. For example, when a single active region is illustrated in a cross-sectional view of a device/structure, the device/structure may include a plurality of active regions and transistor structures (or memory cell structures, gate structures, etc., as appropriate to the case) thereon, as would be illustrated by a plan view of the device/structure.

Hereinafter, test structures of semiconductor devices according to embodiments of the inventive concepts will be described in detail with reference to the drawings.

FIG. 1 is a schematic block diagram illustrating a test system for testing a semiconductor device according to example embodiments of the inventive concepts.

Referring to FIG. 1, a test system includes automatic test equipment (ATE) 1, a device under test (DUT) 2, and test interface equipment 3.

The automatic test equipment 1 may generate a test signal for testing the DUT 2 and may compare a signal outputted from the DUT 2 with a simulation result to evaluate the DUT 2.

The test interface equipment 3 such as a probe card may receive a test signal from the automatic test equipment 1 and may transmit the test signal to the DUT 2.

The DUT 2 may receive the test signal and may be driven based on the test signal. The DUT 2 may be manufactured on a wafer to assist evaluation and/or control of semiconductor manufacturing processes and to evaluate electrical characteristics of semiconductor devices. For example, the DUT 2 may be a semiconductor device or a semiconductor chip such as a test circuit formed on/from a wafer.

Figure 2:
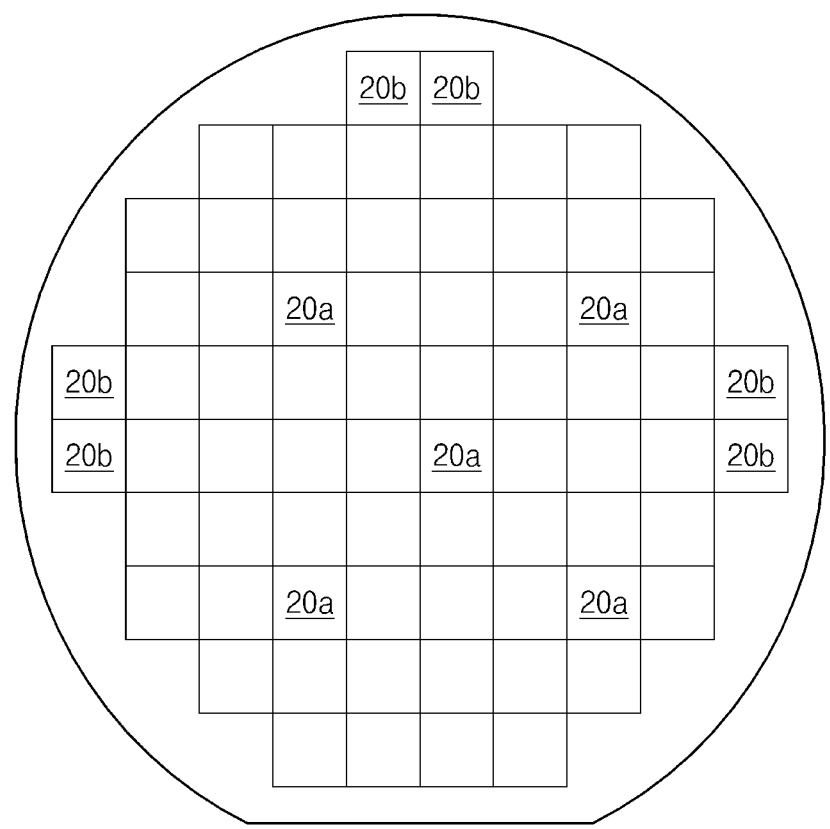
FIG. 2 is a plan view illustrating a wafer on which semiconductor devices according to example embodiments of the inventive concepts are formed.

FIG. 2 is a plan view illustrating a wafer on which semiconductor devices according to example embodiments of the inventive concepts are formed.

Referring to FIG. 2, semiconductor devices may be two-dimensionally arranged on a top surface of a semiconductor wafer 10. The semiconductor devices may include normal semiconductor devices 20a and test semiconductor devices 20b. The normal semiconductor devices 20a may include integrated circuits formed by semiconductor manufacturing processes, and the test semiconductor devices 20b may include test circuits formed for testing the integrated circuits. In some embodiments, the normal semiconductor devices 20a manufactured as products may be formed on the semiconductor wafer 10 together with the test semiconductor devices 20b, and the test semiconductor devices 20b may be disposed on an edge portion of the semiconductor wafer 10. Alternatively, the test semiconductor devices 20b may be formed on a test wafer (e.g., on which test devices are only formed) different from the semiconductor wafer 10 on which the normal semiconductor devices 20a are formed.

Figure 3:
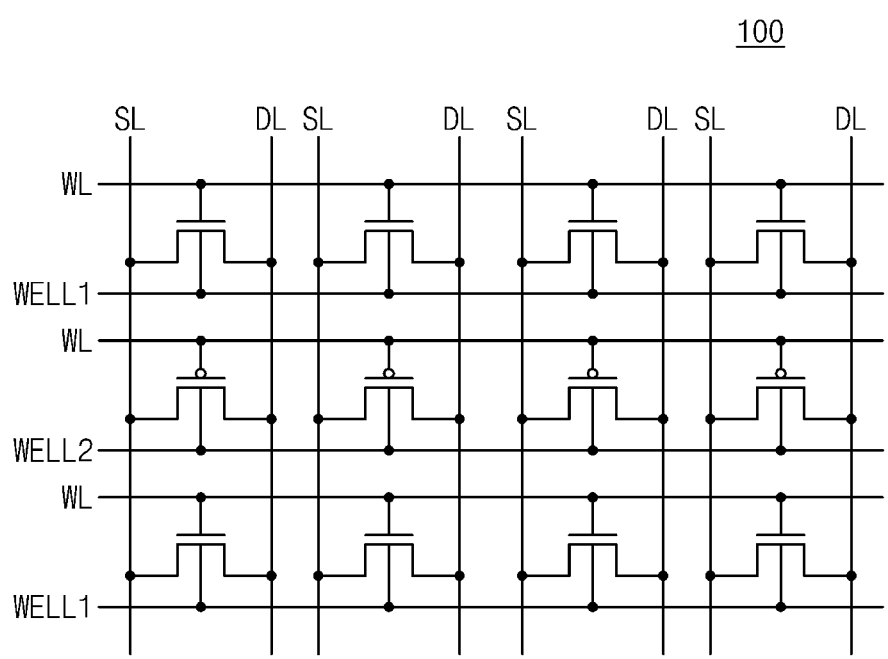
FIG. 3 is a circuit diagram of a semiconductor device according to example embodiments of the inventive concepts.

FIG. 3 is a circuit diagram of a semiconductor device according to example embodiments of the inventive concepts.

Referring to FIG. 3, a semiconductor device such as a test circuit includes a test circuit array 100 formed for testing integrated circuits. In some embodiments, the test circuit array 100 includes a plurality of field effect transistors two-dimensionally arranged.

In some embodiments, the test circuit array 100 includes a plurality of N-type metal-oxide-semiconductor (NMOS) transistors, a plurality of P-type metal-oxide-semiconductor (PMOS) transistors, a plurality of word lines WL, source lines SL, drain lines DL, and first and second well driving lines WELL1 and WELL2. The transistors may be arranged along a row direction and a column direction. Each of rows may consist of the NMOS transistors or the PMOS transistors. For example, a plurality of NMOS transistors may be arranged along a row direction, and connected in parallel to a word line WL along the row direction. In addition, a plurality of PMOS transistors may be arranged along the row direction, and connected in parallel to another word line WL along the row direction, and may be connected in parallel to the NMOS transistors.

The word lines WL may be connected to gate electrodes of the transistors arranged in each row. The first well driving lines WELL1 may be connected to bodies of the NMOS transistors, and the second well driving lines WELL2 may be connected to bodies of the PMOS transistors. Each of the source lines SL may be connected to source electrodes of the transistors arranged in each column, and each of the drain lines DL may be connected to drain electrodes of the transistors arranged in each column.

According to embodiments of the inventive concepts, electrical characteristics of the transistors two-dimensionally arranged may be measured to evaluate process variation of each of predetermined regions of the semiconductor wafer. For example, threshold voltages, turn-on currents, turn-off currents, gate leakage currents, channel leakage currents, and/or junction leakage currents of the transistors may be measured from the test circuit array 100. In addition, since more data of the electrical characteristics of the transistors may be obtained according to a density of the transistors formed in a limited area, and thus, the process variation may be more accurately evaluated.

Figure 4:
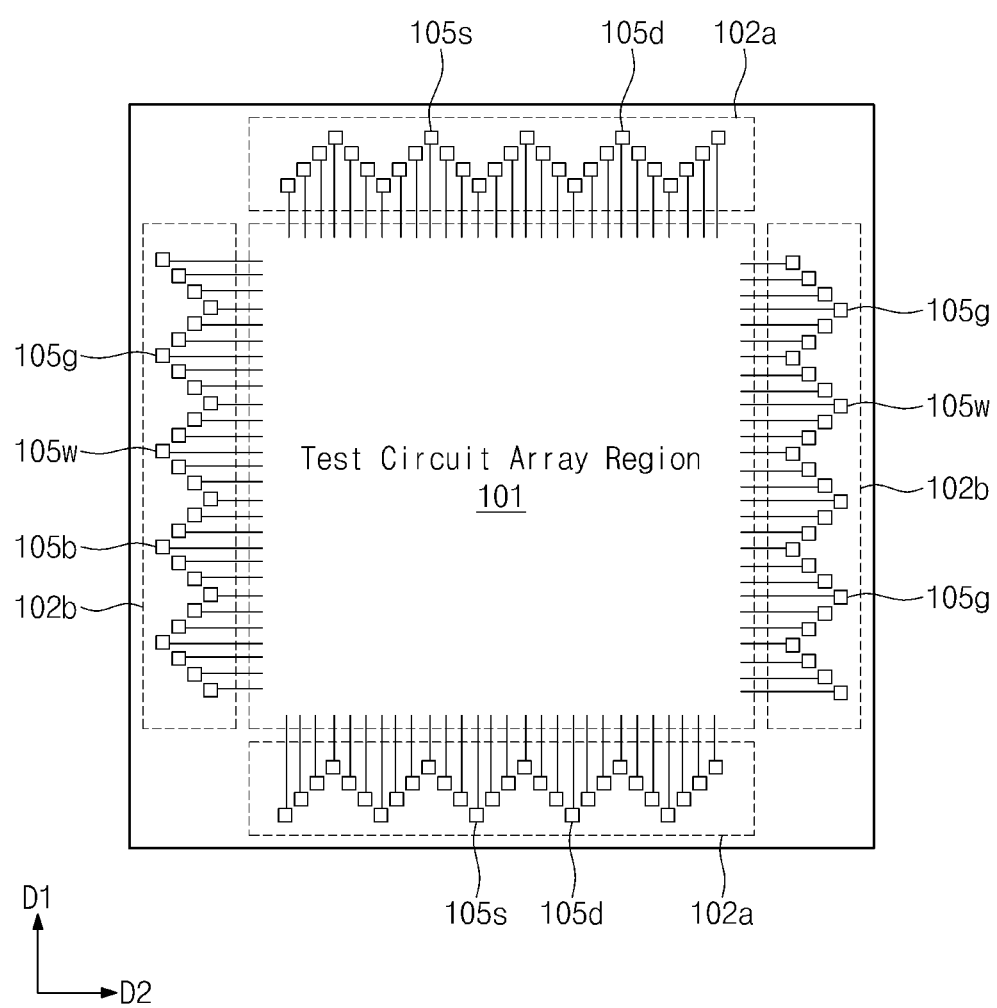
FIG. 4 is a plan view illustrating a semiconductor device according to example embodiments of the inventive concepts.

FIG. 4 is a plan view illustrating a semiconductor device according to example embodiments of the inventive concepts.

Referring to FIG. 4, a semiconductor device such as a test circuit may include a test circuit array region 101 and pad regions 102a and 102b. The test circuit array 100 may be formed in the test circuit array region 101, and the pad regions 102a and 102b may be disposed around the test circuit array region 101.

A plurality of transistors may be disposed in the test circuit array region 101, as described with reference to FIG. 3. Pads 105s, 105d, 105g and 105w electrically connected to the test circuit array 100 may be disposed in the pad regions 102a and 102b. In some embodiments, the pad regions 102a and 102b may include first pad regions 102a facing each other in a first direction D1 and second pad regions 102b facing each other in a second direction D2 perpendicular to the first direction D1. For example, the first pad region 102a may be disposed at a first side of the test circuit array region 101 outside the test circuit array region 101 and a second side of the test circuit array region 101 opposite to the first side, and the second pad region 102b may be disposed at a third side of the test circuit array region 101 perpendicular to the first side and the second side, and a fourth side of the test circuit array region 101 opposite to the third side. The term "pad region" as used herein may be used to refer to the different pad regions, such as the first pad region 102a, or the second pad region 102b shown in FIG. 4, or may more generally refer to the entire region outside of the test circuit array in which pads are formed, or may specifically refer to one of the sub-regions of the first pad region 102a or second pad region 102b. The terms "first pad region," "second pad region," and "sub-pad region" may also refer to one or more of the areas shown by the dotted line boxes that surround sets of pads in the various figures.

The pads 105s, 105d, 105g and 105w may be electrically connected to the test circuit array 100, and test signals provided from test equipment may be inputted to the pads 105s, 105d, 105g and 105w. In some embodiments, the pads 105s, 105d, 105g and 105w may include source pads 105s, drain pads 105d, gate pads 105g, and well pads 105w. In some embodiments, the source pads 105s and the drain pads 105d may be disposed in the first pad regions 102a, and the gate pads 105g and the well pads 105w may be disposed in the second pad regions 102b.

According to some embodiments, a gate voltage may be selectively provided to the gate electrodes of the transistors through the gate pads 105g, and a source voltage may be selectively provided to the source electrodes of the transistors through the source pads 105s. In addition, a drain voltage may be provided to the drain electrodes of the transistors through the drain pads 105d, and a well driving voltage may be provided to the bodies of the transistors through the well pads 105w.

In one embodiment, different pads of a first set of source pads 105s and the drain pads 105d of a first pad region (e.g., one of the first pad regions 102a) disposed adjacent to a first side of the test circuit array region 101 may be disposed at different distances from the first side, different pads of a second set of the source pads 105s and the drain pads 105d of a second pad region (e.g., the other of the first pad regions 102a) disposed adjacent to a second side the test circuit array region 101 may be disposed at different distances from the second side, different pads of a first set of the gate pads 105*g* and the well pads 105*w* of a third pad region (e.g., one of the second pad regions 102*b*) disposed adjacent to a third side of the test circuit array region 101 may be disposed at different distances from the third side, and different pads of a second set of the gate pads 105*g* and the well pads 105*w* of a fourth pad region (e.g., the other of the second pad regions 102*b*) disposed adjacent to a fourth side of the test circuit array region 101 may be disposed at different distances from the fourth side.

In one embodiment, the first set of source pads 105*s* and the drain pads 105*d* of the first pad region disposed adjacent to the first side of the test circuit array region 101 may be disposed in a zigzag pattern along the second direction D2, the second set of source pads 105*s* and the drain pads 105*d* of the second pad region disposed adjacent to the second side of the test circuit array region 101 may be disposed in a zigzag pattern along the second direction D2, the first set of the gate pads 105*g* and the well pads 105*w* of the third pad region disposed adjacent to the third side of the test circuit array region 101 may be disposed in a zigzag pattern along the first direction D1, and the second set of the gate pads 105*g* and the well pads 105*w* of the fourth pad region disposed adjacent to the fourth side of the test circuit array region 101 may be disposed in a zigzag pattern along the first direction D1.

Figure 5:
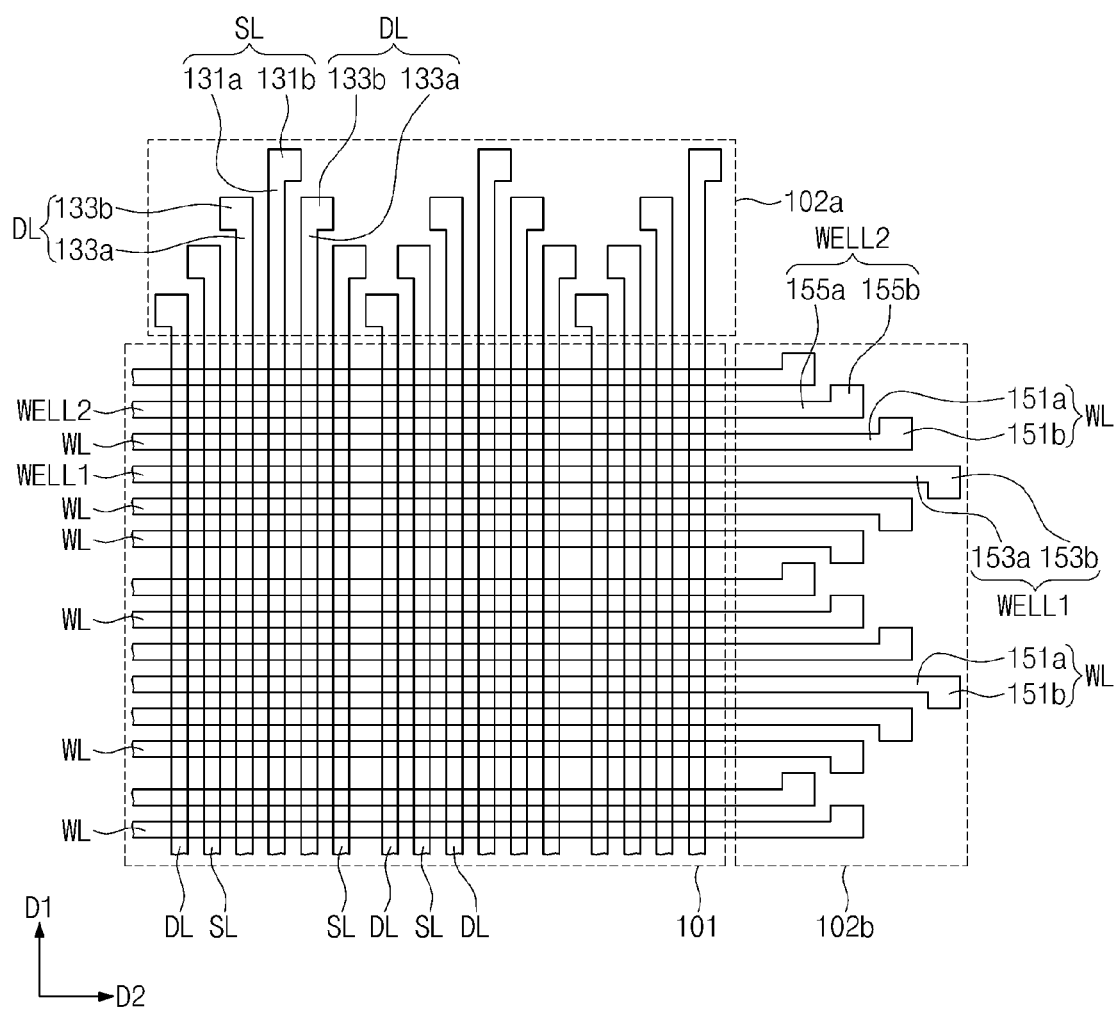
FIG. 5 is a plan view illustrating a portion of a semiconductor device according to example embodiments of the inventive concepts.

FIG. 5 is a plan view illustrating a portion of a semiconductor device according to example embodiments of the inventive concepts.

Referring to FIG. 5, a semiconductor device such as a test circuit includes the test circuit array region 101 and the first and second pad regions 102*a* and 102*b* disposed around the test circuit array region 101, as described with reference to FIG. 4. In addition, the semiconductor device includes a plurality of transistors two-dimensionally arranged, source lines SL, drain lines DL, word lines WL, and first and second well driving lines WELL1 and WELL2, as described with reference to FIG. 3. The source lines SL, the drain lines DL, the word lines WL, and the first and second well driving lines WELL1 and WELL2 are electrically connected to the transistors.

In some embodiments, the source lines SL may extend in a first direction D1 so as to be electrically connected to source electrodes of the transistors, and the drain lines DL may extend in the first direction D1 so as to be electrically connected to drain electrodes of the transistors. In one embodiment, the source lines SL and the drain lines DL may be alternately arranged along a second direction D2 perpendicular to the first direction D1. In another embodiment, each of the drain lines DL may be disposed between the source lines SL adjacent to each other.

In some embodiments, each of the source lines SL includes an interconnection portion 131*a* (e.g., a conductive line) extending from the test circuit array region 101 into the first pad region 102*a* and a pad portion 131*b* connected to an end of the interconnection portion 131*a*. The pad portion 131*b* of the source line SL is disposed in the first pad region 102*a*. Likewise, each of the drain lines DL includes an interconnection portion 133*a* (e.g., a conductive line) extending from the test circuit array region 101 into the first pad region 102*a* and a pad portion 133*b* connected to an end of the interconnection portion 133*a*. The pad portion 133*b* of the drain line DL is disposed in the first pad region 102*a*. Each of the interconnection portions 131*a* and 133*a* may have a first length in the first direction D1 and a first width in the second direction D2, and each of the pad portions 131*b* and 133*b* may have a second length in the first direction D1 and a second width in the second direction D2 greater than the first width of each of the respective interconnection portions 131*a* and 133*a*. In addition, the first lengths of the interconnection portions 131*a* and 133*a* of the source and drain lines SL and DL adjacent to each other may be different from each other. Moreover, the pad portions 131*b* and 133*b* of the source and drain lines SL and DL adjacent to each other may be respectively disposed on virtual lines that extend in the second direction D2 and are different from each other. For example, a distance between the test circuit array region 101 and the pad portion 131*b* of the source line SL may be different from a distance between the test circuit array region 101 and the pad portion 133*b* of the drain region DL adjacent to the source line SL.

In some embodiments, the source voltage may be selectively applied through the pad portions 131*b* of the source lines SL individually separated from each other, and the drain voltage may be selectively applied through the pad portions 133*b* of the drain lines DL individually separated from each other.

In some embodiments, each of the word lines WL may extend in the second direction D2 perpendicular to the first direction D1 so as to be electrically connected to the gate electrodes of the transistors, and each of the well driving lines WELL1 and WELL2 may extend in the second direction D2 so as to be electrically connected to the bodies of the transistors. In some embodiments, the well driving lines WELL1 and WELL2 may include the first well driving lines WELL1 electrically connected to bodies of NMOS transistors and the second well driving lines WELL2 electrically connected to bodies of PMOS transistors.

In some embodiments, each of the word lines WL and the well driving lines WELL1 and WELL2 may include an interconnection portion 151*a*, 153*a* or 155*a* extending on and from the test circuit array region 101 into the second pad region 102*b* and a pad portion 151*b*, 153*b* or 155*b* connected to the interconnection portion 151*a*, 153*a* or 155*a*. The pad portions 151*b*, 153*b* and 155*b* are disposed in the second pad region 102*b*. Each of the interconnection portions 151*a*, 153*a* and 155*a* may have a first length in the second direction D2 and a first width in the first direction D1, and each of the pad portions 151*b*, 153*b* and 155*b* may have a second length in the second direction D2 and a second width in the first direction D1 greater than the first width of each of the interconnection portions 151*a*, 153*a* and 155*a*. In addition, lengths of the interconnection portions of adjacent two of the word and well driving lines WL, WELL1 and WELL2 may be different from each other. The number of the well driving lines WELL1 and WELL2 may be smaller than the number of the word lines WL. The pad portions of the adjacent two of the word and well driving lines WL, WELL1 and WELL2 may be respectively disposed on virtual lines that extend in the first direction D1 and that are different from each other. For example, the pad portions of the adjacent two of the word and well driving lines WL, WELL1 and WELL2 may be disposed at different distances from the test circuit array region 101.

In some embodiments, the gate voltage may be selectively applied through the pad portions 151*b* of the word lines WL individually separated from each other, and the well driving voltage may be applied through the pads 153*b* and 155*b* of the first and second well driving lines WELL1 and WELL2.

Figure 6:
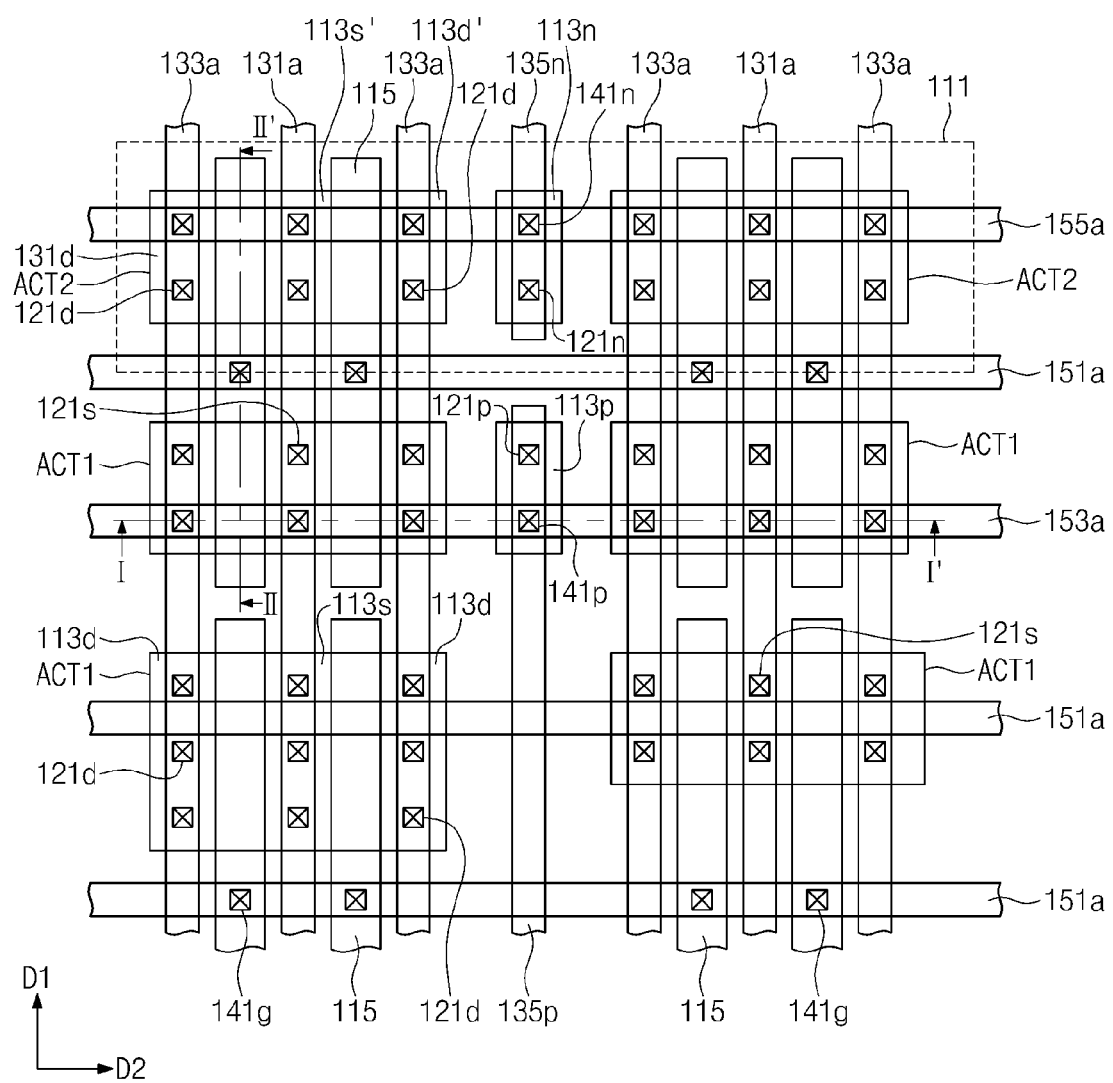
FIG. 6 is a plan view illustrating a test circuit array region of a semiconductor device according to example embodiments of the inventive concepts.
Figure 7:
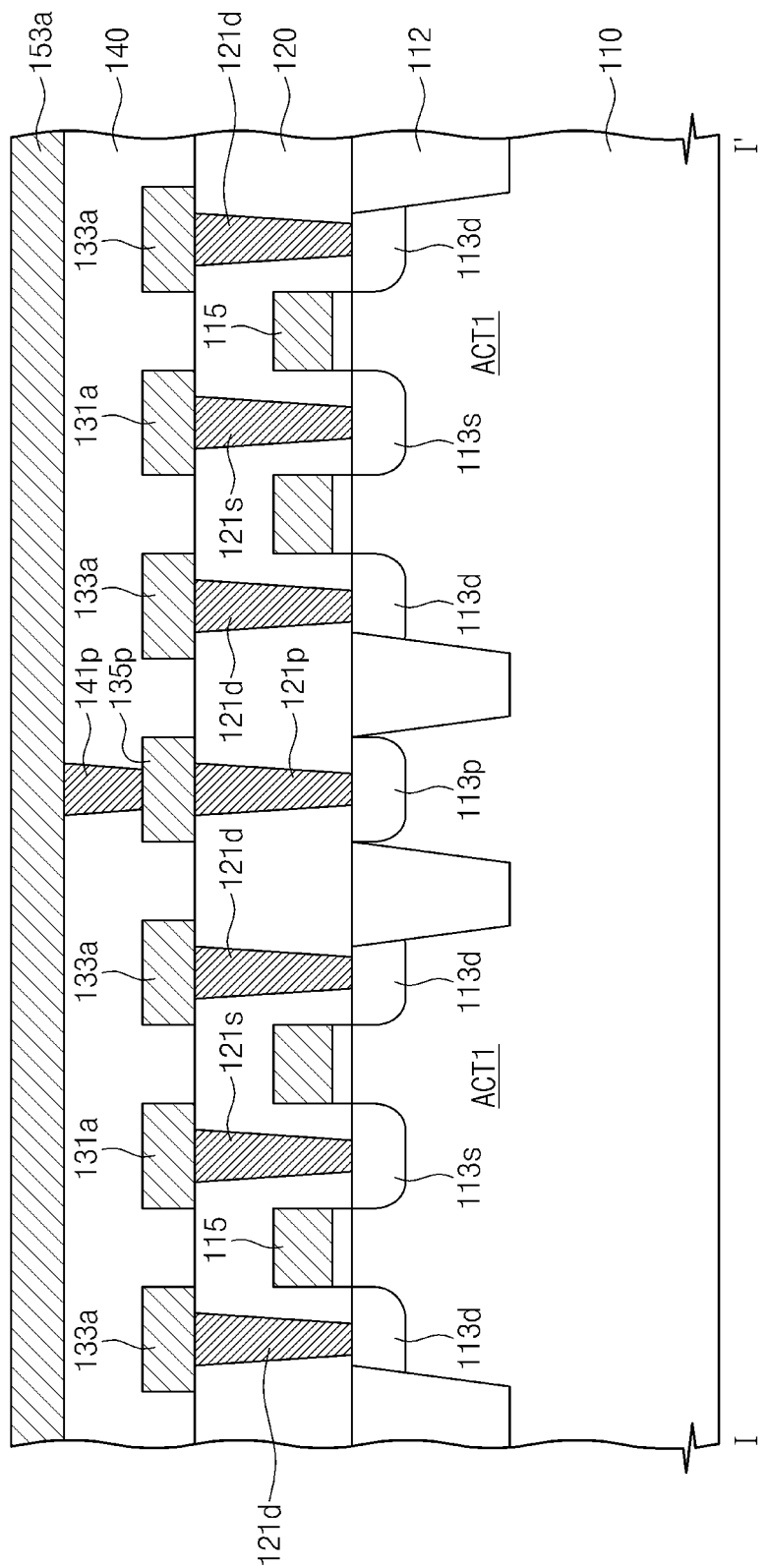
FIG. 7 is a cross-sectional view taken along a line I-I' of FIG. 6 to illustrate a semiconductor device according to example embodiments of the inventive concepts.
Figure 8:
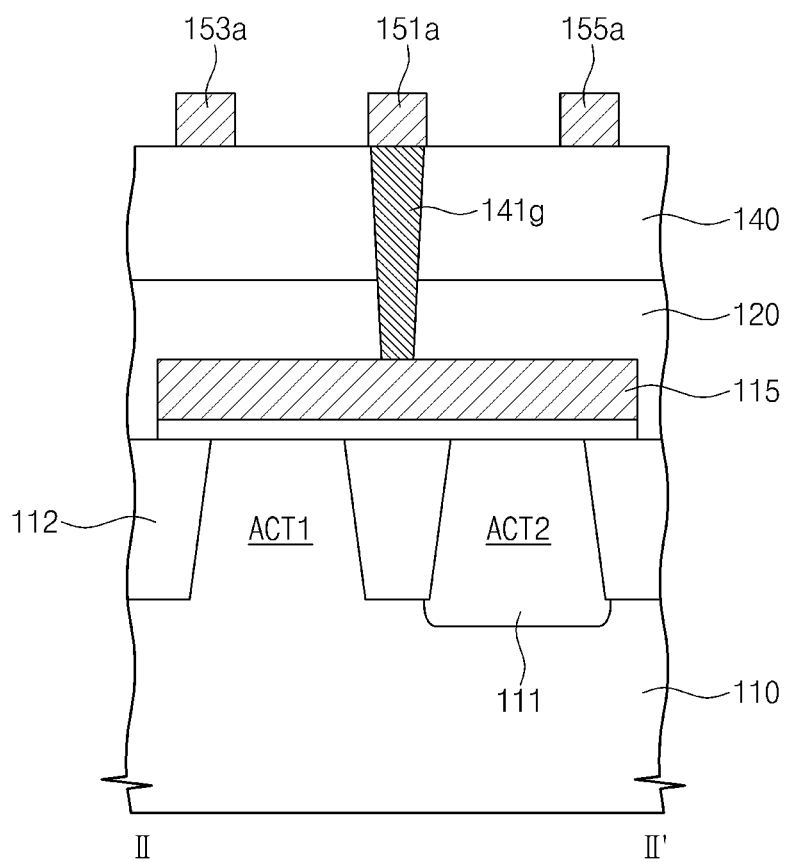
FIG. 8 is a cross-sectional view taken along a line II-II' of FIG. 6 to illustrate a semiconductor device according to example embodiments of the inventive concepts.

FIG. 6 is a plan view illustrating a test circuit array region of a semiconductor device according to example embodiments of the inventive concepts. FIG. 7 is a cross-sectional view taken along a line I-I' of FIG. 6 to illustrate a semiconductor device according to example embodiments of the inventive concepts. FIG. 8 is a cross-sectional view taken along a line II-II' of FIG. 6 to illustrate a semiconductor device according to example embodiments of the inventive concepts.

Referring to FIGS. 6, 7 and 8, a semiconductor device such as a test circuit may include the test circuit array region 101 and pad regions 102a and 102b around the test circuit array region 101 on a semiconductor substrate 110, as described with reference to FIG. 5.

In some embodiments, the semiconductor substrate 110 may have a first conductivity type, and a well dopant layer 111 may be formed in the semiconductor substrate 110. The well dopant layer 111 may have a second conductivity type different from the first conductivity type. A device isolation layer 112 may be formed in or on the semiconductor substrate 110 of the test circuit array region 101. The device isolation layer 112 may define active portions. In some embodiments, a plurality of first active portions ACT1 may be defined in the semiconductor substrate 110, and a plurality of second active portions ACT2 may be defined in the well dopant layer 111. In some embodiments, sizes and shapes of the first and second active portions ACT1 and ACT2 may be variously modified.

Gate electrodes 115 may be disposed on the semiconductor substrate 110 to cross the first and second active portions ACT1 and ACT2, and source and drain dopant regions (e.g., source and drain electrodes) may be formed in each of the first and second active portions ACT1 and ACT2 at both sides of each of the gate electrodes 115. In more detail, the gate electrodes 115 may cross over the first and second active portions ACT1 and ACT2 and may have bar shapes extending in the first direction D1. A gate insulating layer may be disposed between the gate electrodes 115 and the active portions ACT1 and ACT2.

A first set of source and drain dopant regions 113s and 113d may be formed in each of the first active portions ACT1 at both sides of each of the gate electrodes 115 disposed on the first active portions ACT1. The first set of source and drain dopant regions 113s and 113d may be doped with dopants of the second conductivity type. A second set of source and drain dopant regions 113s' and 113d' may be formed in each of the second active portions ACT2 at both sides of each of the gate electrodes 115 disposed on the second active portions ACT2. The second set of source and drain dopant regions 113s' and 113d' may be doped with dopants of the first conductivity type. A first well pickup region 113p doped with dopants of the first conductivity type may be formed in a portion of the semiconductor substrate 110. A second well pickup region 113n doped with dopants of the second conductivity type may be formed in a portion of the well dopant layer 111.

A first interlayer insulating layer 120 may be disposed on the semiconductor substrate 110, and contact plugs may be formed in the first interlayer insulating layer 120. In more detail, source contact plugs 121s may be connected to the first and second source dopant regions 113s and 113s', and drain contact plugs 121d may be connected to the first and second drain dopant regions 113d and 113d'. In addition, first well contact plugs 121p may be connected to the first well pickup region 113p, and second well contact plugs 121n may be connected to the second well pickup region 113n. In some embodiments, the contact plugs 121s, 121d, 121p and 121n may include at least one of a doped semiconductor material (e.g., doped silicon), a metal (e.g., tungsten, aluminum, titanium, and/or tantalum), a conductive metal nitride (e.g., titanium nitride, tantalum nitride, and/or tungsten nitride), or a metal-semiconductor compound (e.g., a metal silicide). In addition, ohmic patterns (not shown) may be disposed between the contact plugs and the dopant regions, respectively. The ohmic patterns may include a metal-semiconductor compound (e.g., a metal silicide such as cobalt silicide or titanium silicide).

The interconnection portions 131a of the source lines, the interconnection portions 133a of the drain lines, and first and second dummy conductive lines 135n and 135p may be disposed on the first interlayer insulating layer 120 and may extend in the first direction D1. For example, the interconnection portions 131a of the source lines, the interconnection portions 133a of the drain lines, and first and second dummy conductive lines 135p and 135n may be spaced apart from each other at a first height above a top surface of the semiconductor substrate 110 in the second direction D2. In one embodiment, each of the interconnection portions 131a of the source lines, the interconnection portions 133a of the drain lines, and first and second dummy conductive lines 135n and 135p may include a first metal formed at a first vertical level from the semiconductor substrate 110. Each of the interconnection portions 131a of the source lines may be electrically connected to the source contact plugs 121s arranged along the first direction D1, and each of the interconnection portions 133a of the drain lines may be electrically connected to the drain contact plugs 121s arranged along the first direction D1. The first dummy conductive line 135p may be electrically connected to the first well contact plug 121p, and the second dummy conductive line 135n may be electrically connected to the second well contact plug 121n. The interconnection portions 131a of the source lines and the interconnection portions 133a of the drain lines may extend into the first pad region 102a of FIG. 5 so as to be connected to the pad portions 131b and 133b of FIG. 5, as described with reference to FIG. 5.

A second interlayer insulating layer 140 may be disposed on the first interlayer insulating layer 120, and gate contact plugs 141g and well contact plugs 141p and 141n may be formed in the second interlayer insulating layer 140. The gate contact plugs 141g may be connected to the gate electrodes 115, and the well contact plugs 141p and 141n may be connected to the first and second dummy conductive lines 135p and 135n, respectively.

In some embodiments, the interconnection portions 151a of the word lines and the interconnection portions 153a and 155a of the first and second well driving lines may be disposed on the second interlayer insulating layer 140 and may extend in the second direction D2. For example, the interconnection portions 151a of the word lines and the interconnection portions 153a and 155a of the first and second well driving lines may be spaced apart from each other at a second height above the top surface of the semiconductor substrate 110 higher than the first height. For example, each of the interconnection portions 151a of the word lines and the interconnection portions 153a and 155a of the first and second well driving lines may include a second metal formed at a second vertical level from the semiconductor substrate 110 higher than the first vertical level. Each of the interconnection portions 151a of the word lines may be electrically connected to the gate contact plugs 141g arranged in the second direction D2. The interconnection portion 153a of the first well driving line may be electrically connected to the first well pickup region 113p through the well contact plug 141p, and the interconnection portion 155a of the second well driving line may be electrically connected to the second well pickup region 113n through the well contact plug 141n. In addition, the interconnection portions 151a of the word lines and the interconnection portions 153a and 155a of the first and second well driving lines may extend into the second pad region 102b of FIG. 5 so as to be connected to the pads 151b, 153b and 155b of FIG. 5, as described with reference to FIG. 5.

Figure 9:
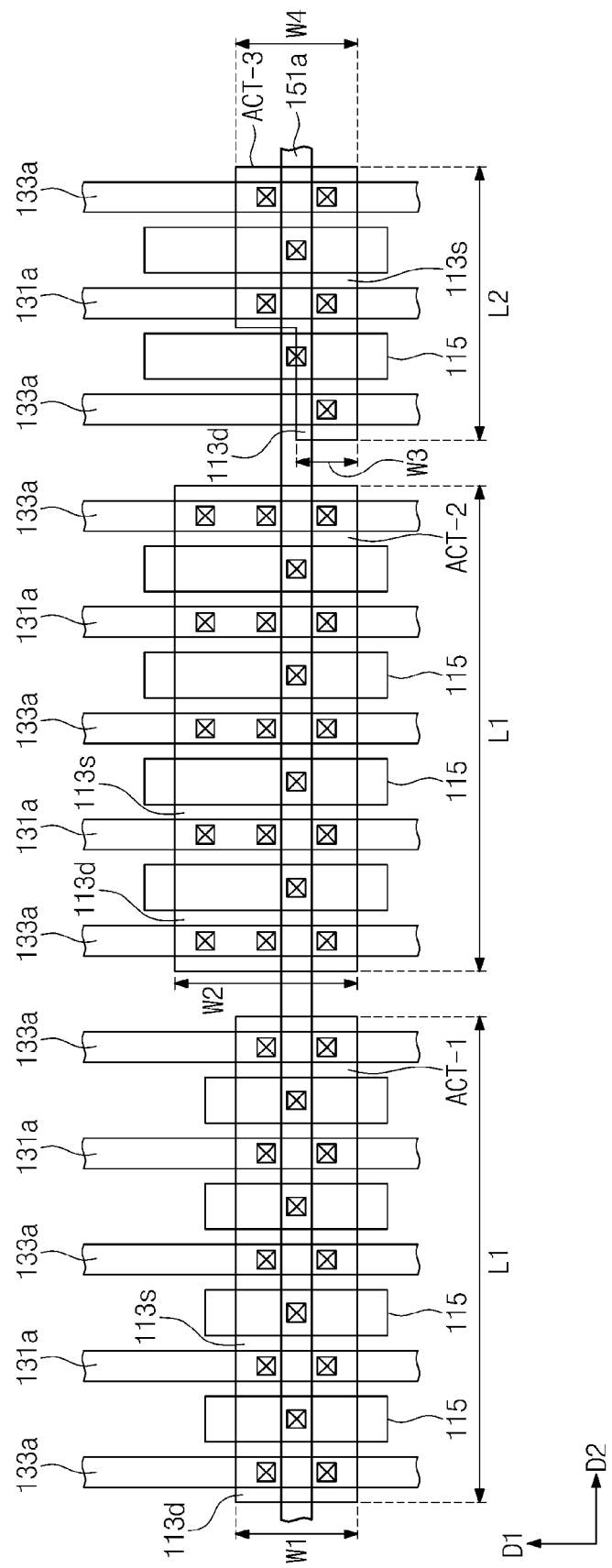
FIG. 9 is a plan view illustrating another portion of a semiconductor device according to example embodiments of the inventive concepts.

FIG. 9 is a plan view illustrating another portion of a semiconductor device according to example embodiments of the inventive concepts.

Referring to FIG. 9, a semiconductor device such as a test circuit may include the test circuit array 100 including transistors having different electrical characteristics from each other. Thus, a plurality of active potions ACT-1, ACT-2 and ACT-3 may be defined in the semiconductor substrate 110 and may have various sizes and shapes.

In some embodiments, the semiconductor device may include active portions ACT-1 and ACT2 having widths W1 and W2 that are different from each other in the first direction D1. Also, the semiconductor device may include active portions ACT-2 and ACT-3 having lengths L1 and L2 that are different from each other in the second direction D2. At least one ACT-3 of the active portions may include a first portion having a first width W3 and a second portion having a second width W4 greater than the first width W3 in the first direction D1. For example, at least one of the active portions may have, for example, an L-shape, a U-shape, a T-shape, or an H-shape.

Gate electrodes 115 may be disposed on the active portions ACT-1, ACT-2 and ACT-3 having various shapes described above, source and drain dopant regions 113s and 113d may be disposed at respective opposite sides of the gate electrodes 115.

As described with reference to FIGS. 6, 7 and 8, the interconnection portions 131a and 133a of the source and drain lines extending in the first direction D1 may be disposed and the interconnection portions 151a of the word lines extending in the second direction D2 may be disposed on the interconnection portions 131a and 133a of the source and drain lines.

Figure 10:
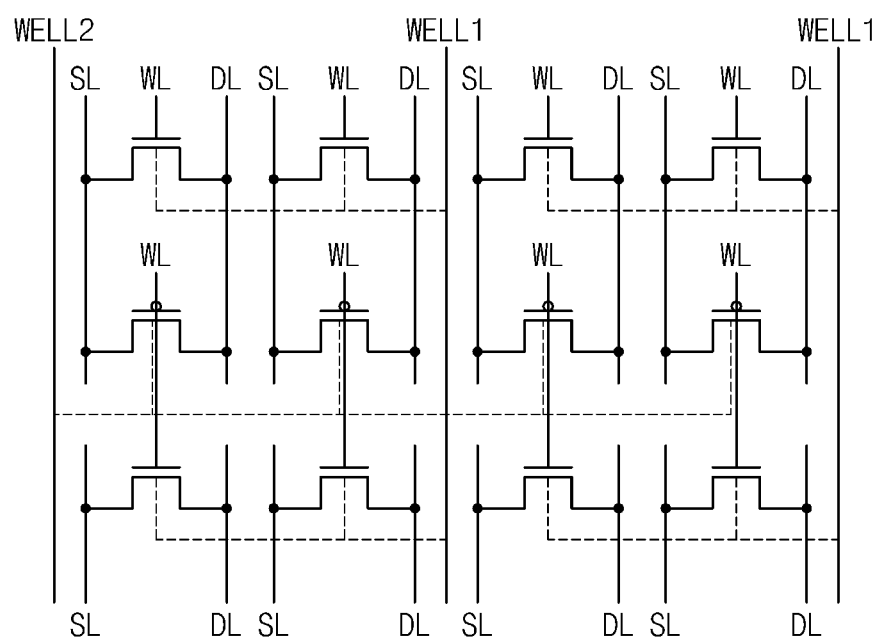
FIG. 10 is a circuit diagram of a semiconductor device according to example embodiments of the inventive concepts.

FIG. 10 is a circuit diagram of a semiconductor device according to example embodiments of the inventive concepts.

Referring to FIG. 10, a semiconductor device such as a test circuit includes a test circuit array 100 formed for testing integrated circuits. In some embodiments, the test circuit array 100 includes a plurality of field effect transistors two-dimensionally arranged.

In some embodiments, the test circuit array 100 includes a plurality of NMOS transistors, a plurality of PMOS transistors, a plurality of word lines WL, source lines SL, drain lines DL, and first and second well driving lines WELL1 and WELL2. The transistors may be arranged along a row direction and a column direction, and each of rows may consist of the NMOS transistors or PMOS transistors.

In some embodiments, the word lines WL may be arranged along the column direction and the row direction. The word lines WL arranged in the column direction may be electrically isolated from each other. Each of the word lines WL may be connected to gate electrodes of some of the transistors arranged in the column direction. Likewise, the source lines SL and the drain lines DL may be arranged along the column direction and the row direction. Each of the source lines SL may be connected to source electrodes of some of the transistors arranged along the column direction, and each of the drain lines DL may be connected to drain electrodes of some of the transistors arranged along the column direction.

The first well driving lines WELL11 may be connected to bodies of the NMOS transistors arranged along the column direction and the row direction, and the second well driving lines WELL2 may be connected to bodies of the PMOS transistors arranged along the column direction and the row direction.

Figure 11:
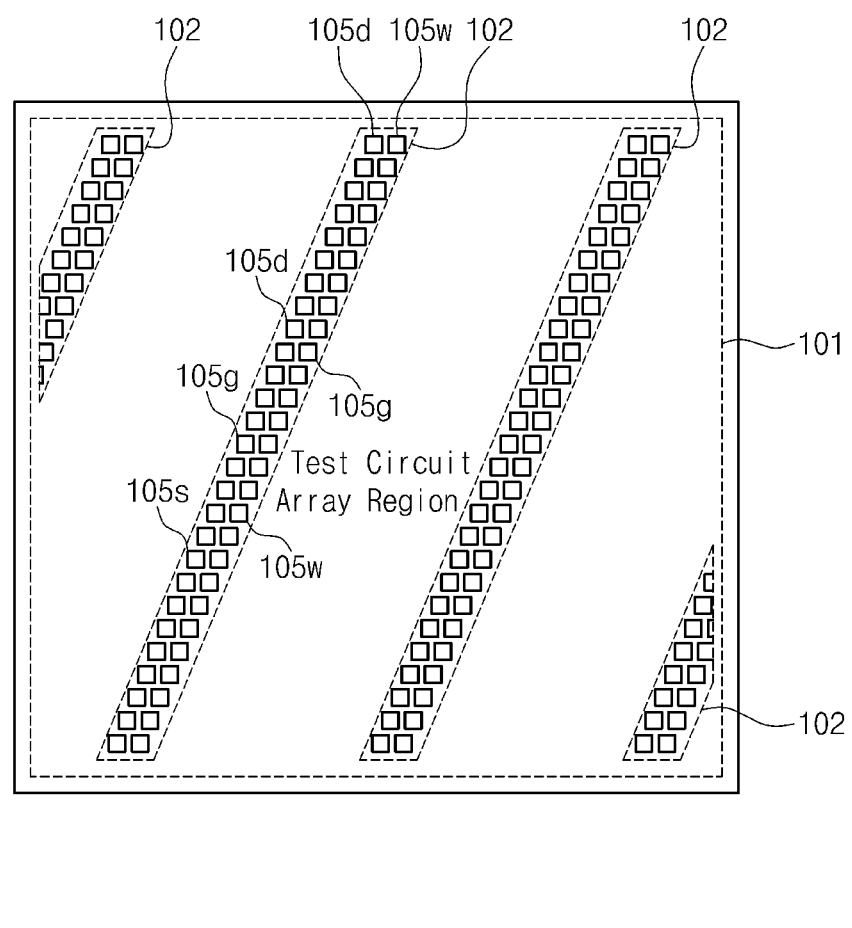
FIG. 11 is a plan view illustrating a semiconductor device according to example embodiments of the inventive concepts.

FIG. 11 is a plan view illustrating a semiconductor device according to example embodiments of the inventive concepts.

Referring to FIG. 11, a semiconductor device such as a test circuit may include a test circuit array region 101 and pad regions 102. The test circuit array 100 of FIG. 10 may be formed in the test circuit array region 101, and pads 105s, 105d, 105g and 105w electrically connected to the test circuit array 100 may be disposed in the pad regions 102. In some embodiments, the pad regions 102 may overlap with some portions of the test circuit array region 101 when viewed from a plan view. For example, the pads 105s, 105d, 105g and 105w may overlap with some portions of the test circuit array 100 when viewed from a plan view. The pads 105s, 105d, 105g and 105w may be arranged along a third direction D3 diagonal to the source, drain and word lines (see SL, DL and WL of FIG. 10) extending in the first direction D1. In some embodiments, the pads 105s, 105d, 105g and 105w may include source pads 105s, drain pads 105d, gate pads 105g, and well pads 105w.

Figure 12:
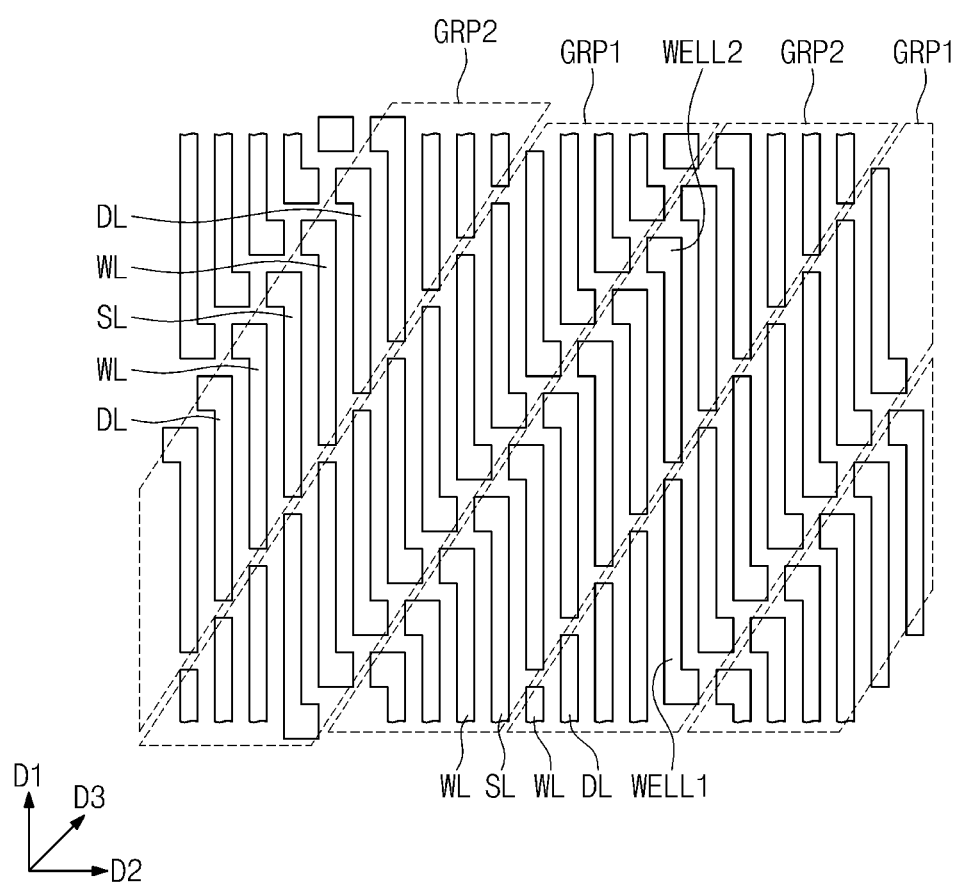
FIG. 12 is a plan view illustrating a portion of a semiconductor device according to example embodiments of the inventive concepts.

FIG. 12 is a plan view illustrating a portion of a semiconductor device according to example embodiments of the inventive concepts.

Referring to FIG. 12, a semiconductor device such as a test circuit includes a plurality of transistors two-dimensionally arranged, source lines SL, drain lines DL, word lines WL, and first and second well driving lines WELL1 and WELL2, as described with reference to FIG. 10. The source, drain, word and well driving lines SL, DL, WL, WELL1 and WELL2 are electrically connected to the transistors.

In some embodiments, the semiconductor device may include first interconnection groups GRP1 and second interconnection groups GRP2. Each of the first and second interconnection groups GRP1 and GRP2 may include the source lines SL, the drain lines DL, the word lines WL, and the first and second well driving lines WELL1 and WELL2. Each of the source, drain, word and well driving lines SL, DL, WL, WELL1 and WELL2 may have an interconnection portion extending in the first direction D1 and a pad portion connected to an end of the interconnection portion. The interconnection portion may have a first length in a first direction D1 and a first width in a second direction D2 greater than the first length, and the pad portion may have a second length in the first direction D1 and a second width in the second direction D2 greater than the first width of the interconnection portion.

The first interconnection group GRP1 and the second interconnection group GRP2 may be point-symmetric with respect to a point of a symmetry axis extending the third direction D3 diagonal to the first and second directions D1 and D2 perpendicular to each other when viewed from a plan view.

For example, the pad portions of the source, drain, word and first and second well driving lines SL, DL, WL, WELL1 and WELL2 may be disposed between the inter connection portions adjacent to each other in the first direction D1. In addition, the pad portions of the source, drain, word and first and second well driving lines SL, DL, WL, WELL1 and WELL2 may be arranged along the third direction D3 diagonal to the first and second directions D1 and D2 perpendicular to each other. Furthermore, the pad portions of the source, drain, word and first and second well driving lines SL, DL, WL, WELL1 and WELL2 may be adjacent to each other in the first direction D1 and the second direction D2.

For example, the pad portions of the source lines SL may be spaced apart from each other in the third direction D3, and the pad portions of the drain lines DL may be spaced apart from each other in the third direction D3. Likewise, the pad portions of the word lines WL may also be spaced apart from each other in the third direction D3. The pad portion of each of the word lines WL may be disposed between the pad portion of the source line SL and the pad portion of the drain line DL in the third direction D3.

Figure 13:
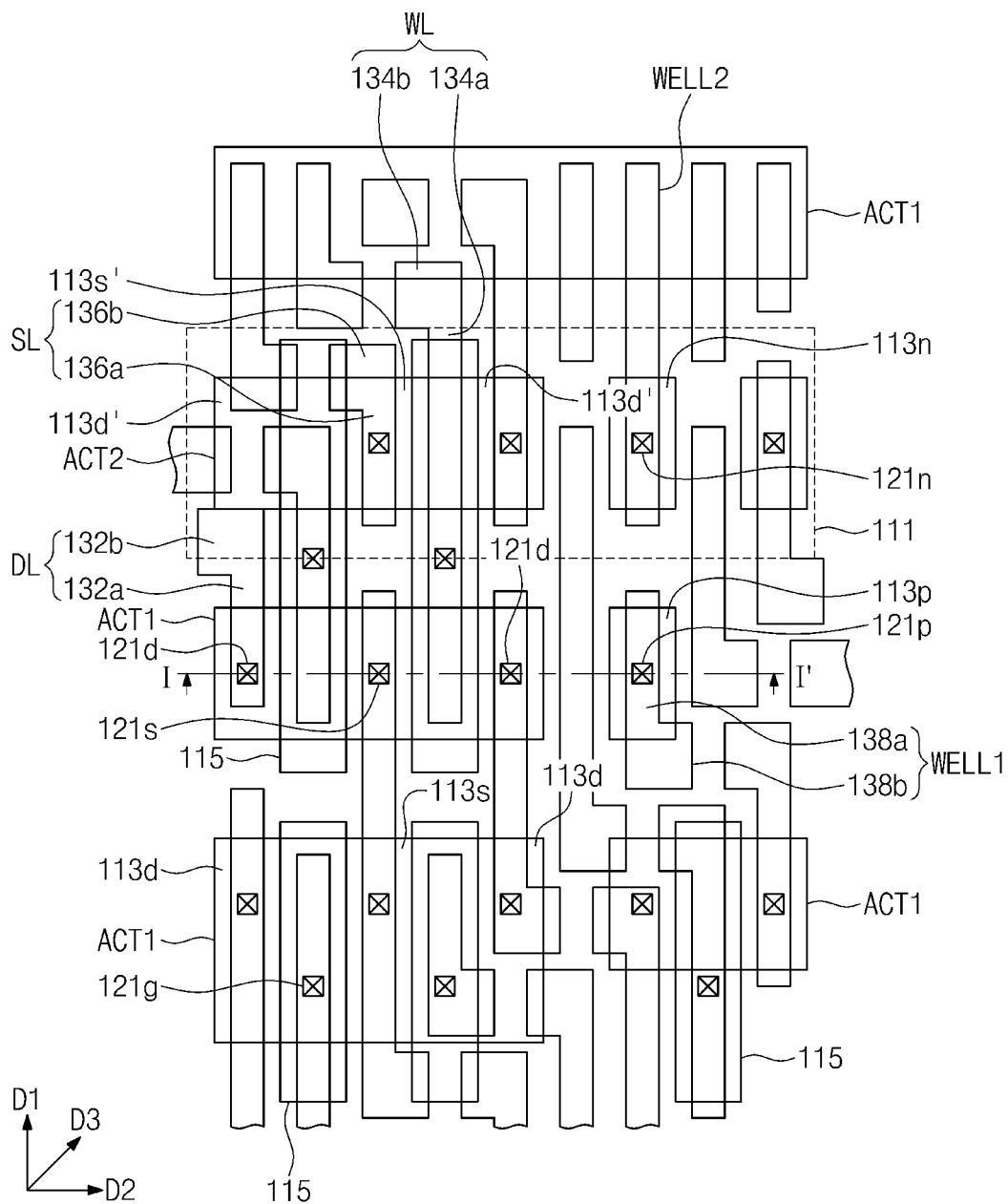
FIG. 13 is a plan view illustrating a test circuit array region of a semiconductor device according to example embodiments of the inventive concepts.
Figure 14:
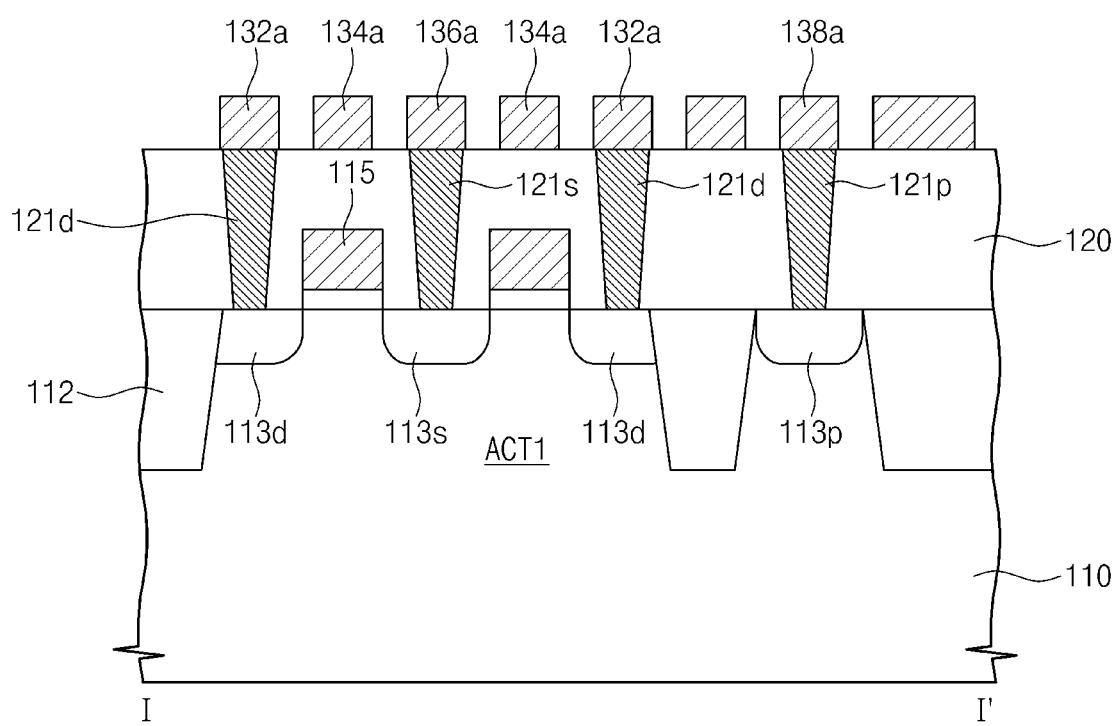
FIG. 14 is a cross-sectional view taken along a line I-I' of FIG. 13 to illustrate a semiconductor device according to example embodiments of the inventive concepts.

FIG. 13 is a plan view illustrating a test circuit array region of a semiconductor device according to example embodiments of the inventive concepts. FIG. 14 is a cross-sectional view taken along a line I-I' of FIG. 13 to illustrate a semiconductor device according to example embodiments of the inventive concepts.

Referring to FIGS. 13 and 14, a semiconductor substrate 110 may have a first conductivity type, and a well dopant layer 111 may be formed in the semiconductor substrate 110. The well dopant layer 111 may have a second conductivity type different from the first conductivity type. A device isolation layer 112 may be formed in or on the semiconductor substrate 110 of the test circuit array region 101 to define active portions. In some embodiments, a plurality of first active portions ACT1 may be defined in the semiconductor substrate 110, and a plurality of second active portions ACT2 may be defined in the well dopant layer 111. In some embodiments, sizes and shapes of the first and second active portions ACT1 and ACT2 may be variously modified.

Gate electrodes 115 may be disposed on the semiconductor substrate 110 to cross each of the first and second active portions ACT1 and ACT2, and source and drain dopant regions (e.g., source and drain electrodes) may be formed in each of the first and second active portions ACT1 and ACT2 at respective opposite sides of each of the gate electrodes 115. In some embodiments, the gate electrodes 115 may cross over the first and second active portions ACT1 and ACT2 and may have bar shapes extending in the first direction D1. A gate insulating layer may be disposed between the gate electrodes 115 and the active portions ACT1 and ACT2.

A first set of source and drain dopant regions 113s and 113d may be formed in each of the first active portions ACT1 at respective opposite sides of each of the gate electrodes 115 disposed on the first active portions ACT1. The first set of source and drain dopant regions 113s and 113d may be doped with dopants of the second conductivity type. A second set of source and drain dopant regions 113s' and 113d' may be formed in each of the second active portions ACT2 at respective opposite sides of each of the gate electrodes 115 disposed on the second active portions ACT2. The second set of source and drain dopant regions 113s' and 113d' may be doped with dopants of the first conductivity type.

A first well pickup region 113p doped with dopants of the first conductivity type may be formed in the semiconductor substrate 110. A second well pickup region 113n doped with dopants of the second conductivity type may be formed in the well dopant layer 111.

A first interlayer insulating layer 120 may be disposed on the semiconductor substrate 110, and contact plugs may be formed in the first interlayer insulating layer 120. In more detail, source contact plugs 121s may be connected to the first and second source dopant regions 113s and 113s', and drain contact plugs 121d may be connected to the first and second drain dopant regions 113d and 113d'. In addition, a first well contact plug 121p may be connected to the first well pickup region 113p, and a second well contact plug 121n may be connected to the second well pickup region 113n. Gate contact plugs 121g may penetrate the first interlayer insulating layer 120 and may be connected to the gate electrodes 115.

In the present embodiment, source lines SL, drain lines DL, word lines WL, and first and second well driving lines WELL1 and WELL2 may be disposed on the first interlayer insulating layer 120 to extend in the first direction D1. For example, the source lines SL, the drain lines DL, the word lines WL, and the first and second well driving lines WELL1 and WELL2 may be spaced apart from each other at a first height above a top surface of the semiconductor substrate 110 in the second direction D2. In one embodiment, each of the source lines SL, drain lines DL, word lines WL, and first and second well driving lines WELL1 and WELL2 of the first interconnection groups GRP1 and second interconnection groups GRP2 may include a first metal formed at a first vertical level from the semiconductor substrate 110. In addition, each of the source, drain, word and first and second well driving lines SL, DL, WL, WELL1 and WELL2 may have an interconnection portion 136a, 132a, 134a or 138a extending in the first direction D1 and a pad portion 136b, 132b, 134b or 138b connected to an end portion of the interconnection portion 136a, 132a, 134a or 138a, as described with reference to FIG. 12.

In the present embodiment, the drain lines DL may be spaced apart from each other in the first direction D1, and the interconnection portions 132a of the drain lines DL may be in contact with the drain contact plugs 121d. Lengths of the interconnection portions 132a of the drain lines DL may be different from each other, and the pad portion 132b may be connected to the end of the interconnection portion 132a of each of the drain lines DL.

The word lines WL may be spaced apart from each other in the first direction D1, and the interconnection portions 134a of the word lines WL may be in contact with the gate contact plugs 121g. Lengths of the interconnection portions 134a of the word lines WL may be different from each other, and the pad portion 134b may be connected to the end of the interconnection portion 134a of each of the word lines WL. The interconnection portion 134a of each of the word lines WL may be disposed between the interconnection portions 132a and 136a of the source and drain lines SL and DL.

Likewise, the source lines SL may be spaced apart from each other in the first direction D1, and the interconnection portions 136a of the source lines SL may be in contact with the source contact plugs 121s. Lengths of the interconnection portions 136a of the source lines SL may be different from each other, and the pad portion 136b may be connected to the end of the interconnection portion 136a of each of the source lines SL.

The interconnection portion 138a of the first well driving line WELL1 may be in contact with the first well contact plug 121p, and the pad portion 138b may be connected to the end of the interconnection portion 138a of the first well driving line WELL1. Likewise, the interconnection portion of the second well driving line WELL2 may be in contact with the second well contact plug 121n. The second well driving line WELL2 may have the pad portion connected to the end of the interconnection portion 138a.

As mentioned with reference to FIG. 12, the source lines SL, the drain lines DL, the word lines WL, and the first and second well driving lines WELL1 and WELL2 may be arranged along the third direction D3 diagonal to the first and second directions D1 and D2 perpendicular to each other when viewed from a plan view. The pad portions 136b, 132b, 134b and 138b of the source, drain, word and first and second well driving lines SL, DL, WL and WELL1 and WELL2 may be adjacent to each other in the first direction D1 and the second direction D2. In addition, the pad portions 136b, 132b, 134b and 138b of the source, drain, word and first and second well driving lines SL, DL, WL and WELL1 and WELL2 may overlap with the device isolation layer 112, the gate electrodes 115 and/or the first and second active portions ACT1 and ACT2.

Figure 15:
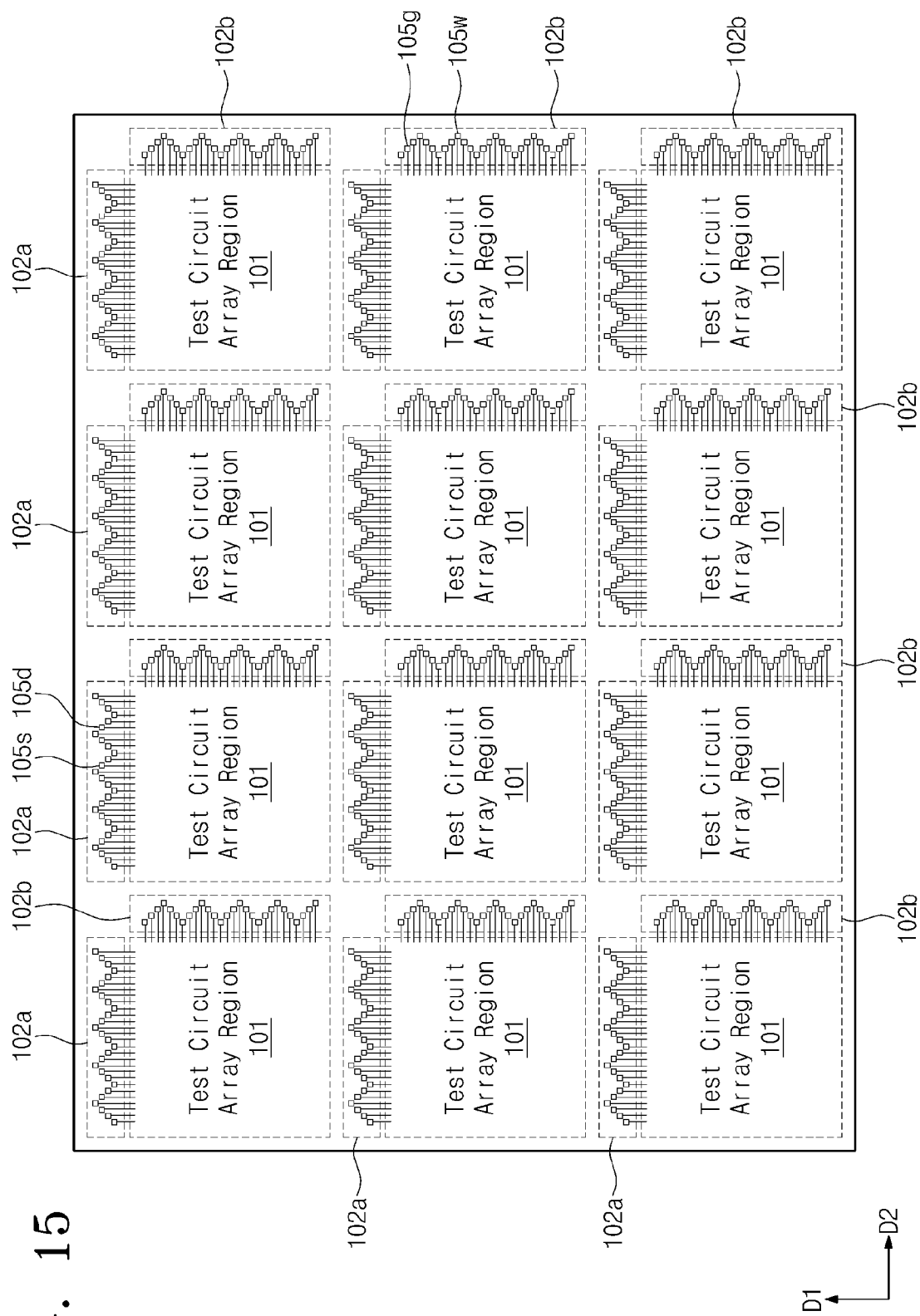
FIGS. 15 and 16 are plan views illustrating semiconductor devices according to example embodiments of the inventive concepts.
Figure 16:
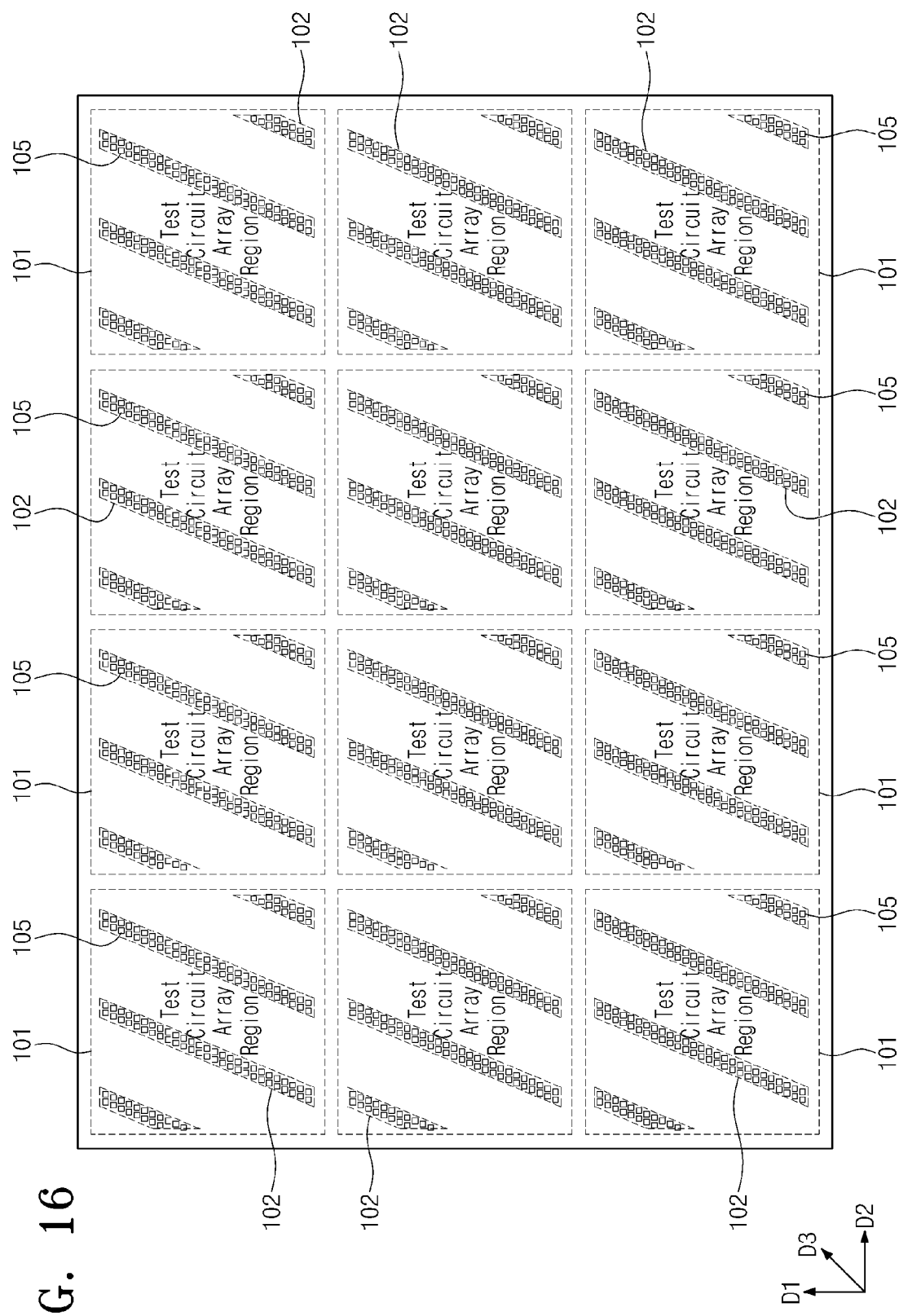

FIGS. 15 and 16 are plan views illustrating semiconductor devices according to example embodiments of the inventive concepts.

Referring to FIG. 15, a semiconductor device may include a plurality of test circuits. For example, the semiconductor device may include a plurality of test circuit array regions 101, and pad regions 102a and 102b may be disposed around each of the test circuit array regions 101.

The test circuit array 100 described with reference to FIG. 3 may be disposed in each of the test circuit array regions 101. Pads may be disposed on the pad regions 102a and 102b, and test signals may be applied from test equipment to the pads. The pads may be electrically connected to the test circuit array 100. The pads in each of the pad regions 102a and 102b may be disposed as described with reference to FIGS. 4 and 5. The pad regions 102a and 102b may include first pad regions 102a facing each other in a first direction D1 and second pad regions 102b facing each other in a second direction D2 perpendicular to the first direction D1. Source pads 105s and drain pads 105d may be disposed in the first pad regions 102a, and gate pads 105g and well pads 105w may be disposed in the second pad regions 102b.

Referring to FIG. 16, a semiconductor device may include a plurality of test circuits. For example, the semiconductor device may include a plurality of test circuit array regions 101, and a plurality of pad regions 102 may be disposed in each of the test circuit array regions 101. Pads 105 may be arranged in each of the pad regions 102 as described with reference to FIGS. 11 and 12. For example, the pads 105 may overlap with portions of the test circuit array 100 when viewed from a plan view. The pads 105 may be arranged in a third direction D3 diagonal to first and second directions D1 and D2 perpendicular to each other. Source pads, drain pads, gate pads, and well pads may be disposed in each of the pad regions 102.

Figure 17:
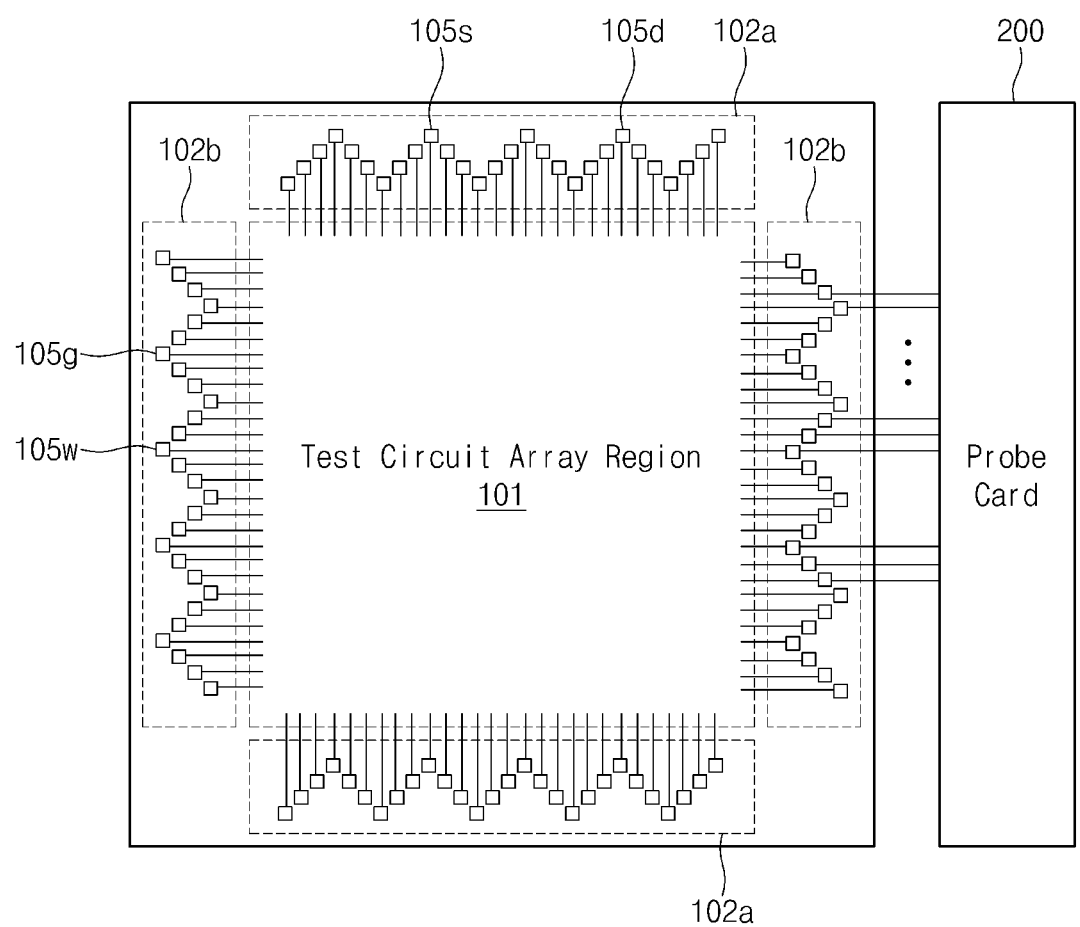
FIGS. 17 and 18 are diagrams illustrating a connection between semiconductor test equipment and a semiconductor device according to example embodiments of the inventive concepts.
Figure 18:
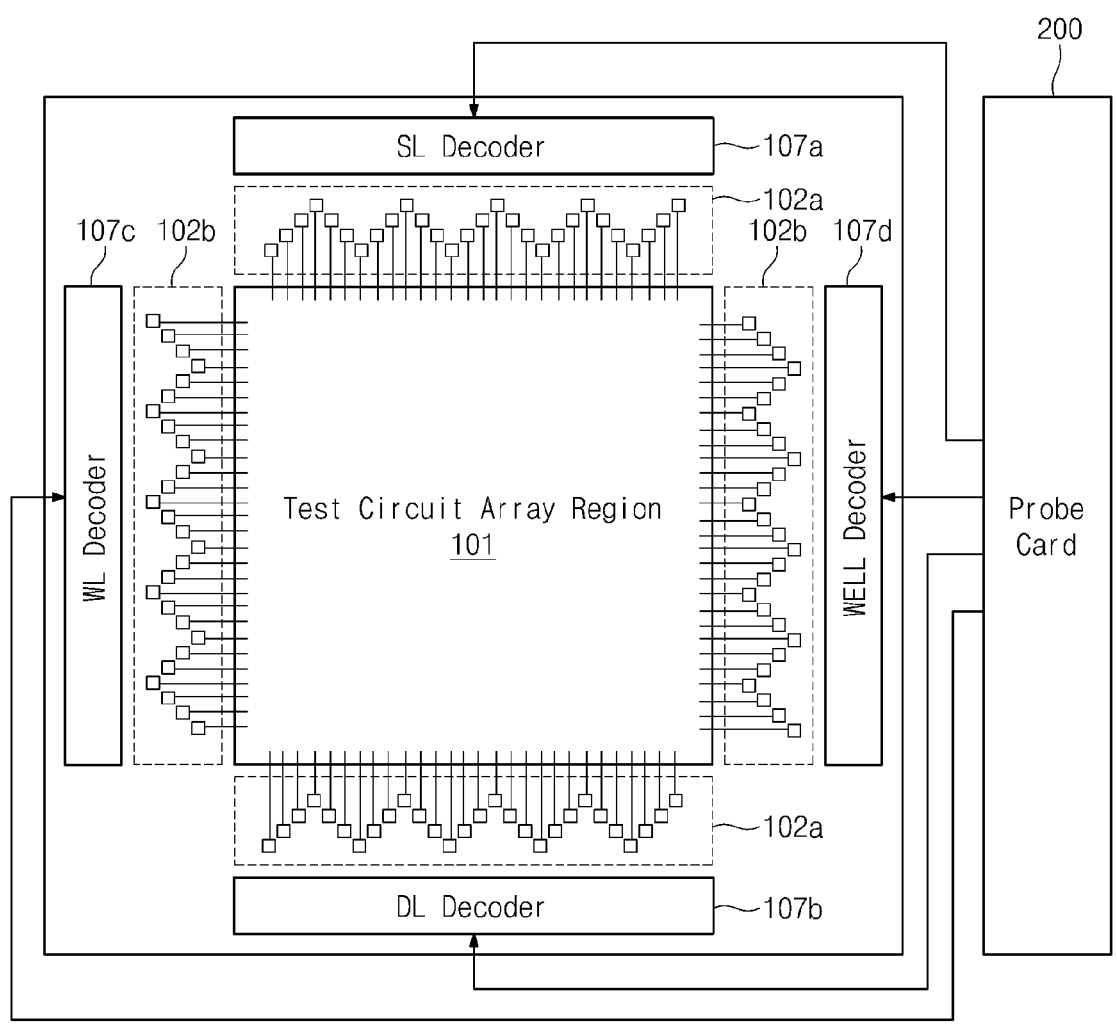

FIGS. 17 and 18 are diagrams illustrating a connection between test interface equipment and a semiconductor device according to example embodiments of the inventive concepts.

Referring to FIG. 17, the pads 105s, 105d, 105g and 105w of the semiconductor device according to embodiments may become in contact with test interface equipment (e.g., probe pins of a probe card 200). For example, the pads 105s, 105d, 105g and 105w of the semiconductor device may be disposed around the test circuit array region 101, and the probe pins of the probe card 200 may be disposed to correspond to the pads 105s, 105d, 105g and 105w, respectively. The probe pins provides test signals outputted from the test equipment into the pads 105s, 105d, 105g and 105w.

In some embodiments, if the pad regions overlap with the test circuit array region 101 as illustrated in FIGS. 11 and 12, the probe pins of the probe card 200 may be disposed on the test circuit array region 101. For example, the probe pins of the probe card 200 may be arranged to be the substantially same as the pads of the semiconductor device. Since the probe pins are disposed to respectively correspond to the pads 105s, 105d, 105g and 105w, the test signals may be inputted to the pads of the semiconductor device at the same time when the semiconductor device is tested.

Referring to FIG. 18, a semiconductor device may include a plurality of decoders 107a, 107b, 107c and 107d used for select the transistors of the test circuit array 100. In some embodiments, the decoders 107a, 107b, 107c and 107d may be electrically connected to the pads disposed in the pad regions 102a and 102b. For example, the semiconductor device may include a source line decoder 107a, a drain line decoder 107b, a word line decoder 107c, and a well driving line decoder 107d. The word line decoder 107c may be electrically connected to the word lines and may selectively provide the test signal to the word lines WL. The source line decoder 107a may be electrically connected to the source lines and may selectively provide the test signal to the source lines. The drain line decoder 107b may be electrically connected to the drain lines and may selectively provide the test signal to the drain lines.

In the present embodiment, the test signals outputted from the test equipment may be provided to the test circuit array 100 through the decoders 107a, 107b, 107c and 107d of the semiconductor device. As described above, since the semiconductor device includes the source line decoder 107a, the drain line decoder 107b, the word line decoder 107c, and the well driving line decoder 107d, each of the transistors of the test circuit array 100 may be selectively accessed.

Figure 19:
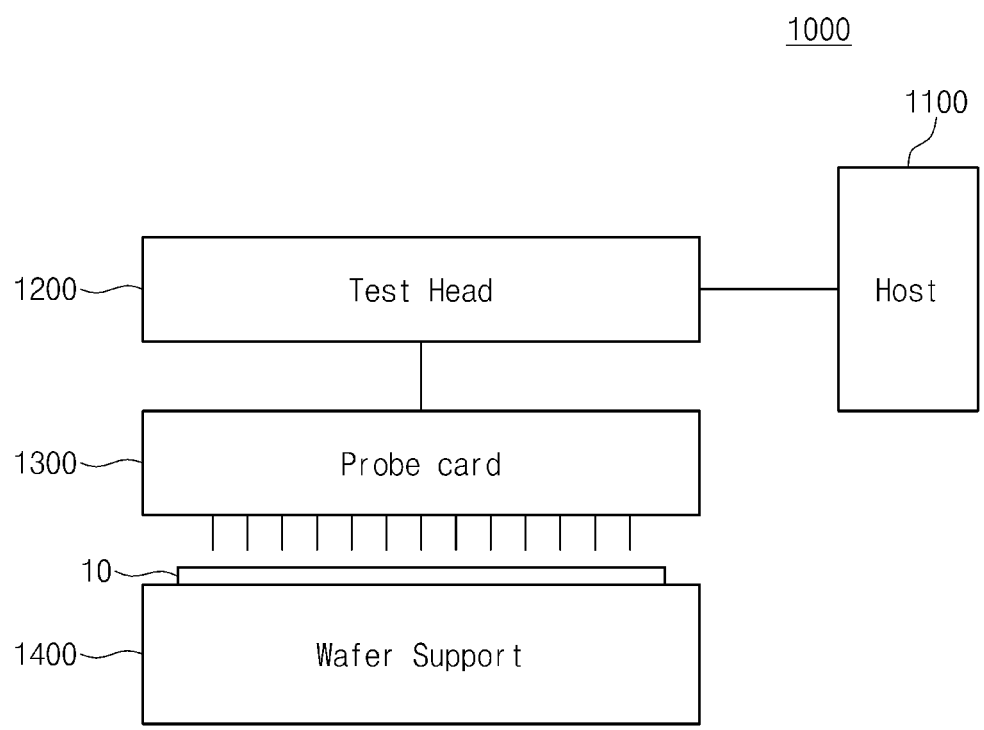
FIG. 19 is a schematic block diagram illustrating a test system according to certain embodiments of the inventive concepts.

FIG. 19 is a schematic block diagram illustrating a test system according to certain embodiments of the inventive concepts.

Referring to FIG. 19, a test system 1000 may include a host 1100, a test head 1200, a probe card 1300, a semiconductor wafer 10 on which devices under test are formed, and a wafer support 1400.

Semiconductor devices disclosed above may be formed on the semiconductor wafer 10, and the semiconductor wafer 10 may be located on the wafer support 1400.

The host 1100 may generate test signals and may receive test result signals generated from the semiconductor wafer 10 on which the semiconductor devices are formed. The host 110 may be, for example, a personal computer or a general purpose computer (e.g., a workstation). The test head 1200 may be connected to the host 1100, and the probe card 1300 may be installed to the test head 1200. The test head 1200 may control of a position of the probe card 1300 to bring probe pins of the probe card 1300 into contact with the pads formed on the semiconductor wafer 10. The host 1100, the test head 1200, and the wafer support 1400 may constitute automatic test equipment (ATE).

The probe card 1300 may include the probe pins used for applying the test signals to the pads of the semiconductor device. The probe card 1300 may transmit the test result signals outputted from the semiconductor device to the test head 1200.

The test signals generated from the host 1100 may be transmitted to the pads of the semiconductor device through the test head 1200 and the probe card 1300. The test result signals outputted from the semiconductor device may be inputted into the host 1100 through the probe card 1300 and the test head 1200. In the host 1100, the test result signals may be compared with a simulation result to evaluate the semiconductor device.

Figure 20:
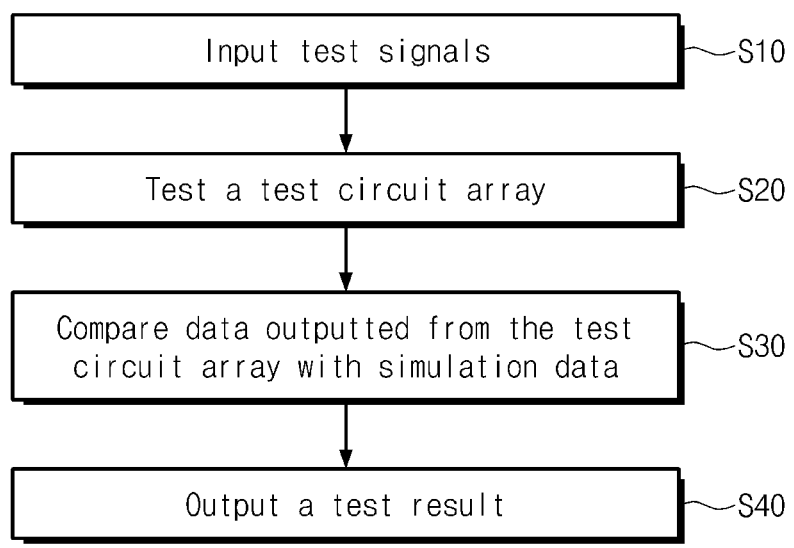
FIG. 20 is a flowchart illustrating a method of testing a semiconductor device according to example embodiments of the inventive concepts.

FIG. 20 is a flowchart illustrating a method of testing a semiconductor device according to example embodiments of the inventive concepts.

Referring to FIG. 20, test signals outputted from test equipment may be inputted to the pads connected to the test circuit array of the semiconductor device (S10). The test circuit array of the semiconductor device may be tested (S20). Thus, a threshold voltage, a turn-on current, a turn-off current, a gate leakage current, a channel leakage current, and/or a junction leakage current may be measured from each of the transistors of the test circuit array. Thereafter, data measured from the semiconductor device may be compared with simulation data obtained by simulation (S30). Next, a final test result of all the transistors and positions of all the transistors may be outputted (S40).

According to some embodiments of the inventive concepts, semiconductor devices such as test semiconductor devices may be disposed on the semiconductor wafer and each of the test semiconductor devices includes the test circuit array consisting of the plurality of transistors. The pads may be arranged to input the test signals to the test circuit array at the same time, and thus, threshold voltages, current and voltage characteristics, and/or leakage currents of the transistors may be measured in a short time through the pads.

According to other embodiments of the inventive concepts, the transistors of the test circuit array may be selectively accessed to easily measure the electrical characteristics of the transistors. In other words, the semiconductor device may be rapidly and accurately tested.

While the disclosure been described with reference to example embodiments, it will be apparent to those skilled in the art that various changes and modifications may be made without departing from the spirits and scopes of the inventive concepts. Therefore, it should be understood that the above embodiments are not limiting, but illustrative. Thus, the scopes of the inventive concepts are to be determined by the broadest permissible interpretation of the following claims and their equivalents, and shall not be restricted or limited by the foregoing description.

What is claimed is:

1. A semiconductor device comprising:
   a semiconductor substrate;
   a test circuit array region on the semiconductor substrate;
   a pad region on the semiconductor substrate and at at least a first side of the test circuit array region and outside of the test circuit array region;
   transistors arranged in the test circuit array region in a first direction and a second direction perpendicular to the first direction;
   source lines spaced apart from each other in the second direction, each of the source lines extending in the first direction and electrically connected to corresponding source electrodes of the transistors; and
   drain lines spaced apart from each other in the second direction, each of the drain lines extending in the first direction and electrically connected to corresponding drain electrodes of the transistors,
   wherein each of the source lines and the drain lines comprises:
     a first interconnection portion having a first length in the first direction and a first width in the second direction less than the first length, the first interconnection portion disposed in the test circuit array region; and
     a first pad portion having a second length in the first direction and a second width in the second direction greater than the first width, the first pad portion disposed in the pad region, and
   wherein different first pad portions of the source and drain lines are disposed in the pad region at different distances from the first side of the test circuit array region.

2. The semiconductor device of claim 1, further comprising:
   word lines spaced apart from each other in the first direction, each of the word lines extending in the second direction and electrically connected to corresponding gate electrodes of the transistors,
   wherein each of the word lines comprises:
     a second interconnection portion having a first length in the second direction and a first width in the first direction less than the first length of the second interconnection portion, the second interconnection portion disposed in the test circuit array region; and
     a second pad portion having a second length in the second direction and a second width in the first direction greater than the first width of the second interconnection portion, the second pad portion disposed in the pad region, and
   wherein different second pad portions of the word lines are disposed in the pad region at different distances from a second side of the test circuit array region perpendicular to the first side of the test circuit array region.

3. The semiconductor device of claim 2, wherein the source lines and the drain lines are disposed at a first height above a top surface of the semiconductor substrate, and
   wherein the word lines are disposed at a second height higher than the first height above the top surface of the semiconductor substrate.

4. The semiconductor device of claim 1, further comprising:
   well driving lines spaced apart from each other in the first direction,
   wherein each of the well driving lines extends in the second direction and is electrically connected to corresponding bodies of the transistors,
   wherein each of the well driving lines comprises:
     a third interconnection portion having a first length in the second direction and a first width in the first direction less than the first length of the third interconnection portion, the third interconnection portion disposed in the test circuit array region; and
     a third pad portion having a second length in the second direction and a second width in the first direction greater than the first width of the third interconnection portion, the third pad portion disposed in the pad region, and
   wherein different third pad portions of the well driving lines are disposed in the pad region at different distances from a second side of the test circuit array region perpendicular to the first side of the test circuit array region.

5. The semiconductor device of claim 1, wherein the transistors comprise:
   a plurality of NMOS transistors arranged in the second direction; and
   a plurality of PMOS transistors connected in parallel to the NMOS transistors and arranged in the second direction and spaced apart from the plurality of NMOS transistors.

6. The semiconductor device of claim 1, further comprising,
   a well dopant layer having a second conductivity type, the well dopant layer formed in the semiconductor substrate which has a first conductivity type different from the second conductivity type, wherein the transistors comprise:
- a plurality of active portions disposed in the semiconductor substrate and the well dopant layer;
- gate electrodes crossing the active portions; and
- source and drain electrodes formed in the active portions at respective opposite sides of each of the gate electrodes.

7. The semiconductor device of claim 6, wherein the active portions have different widths from each other in the first direction or the second direction.

8. The semiconductor device of claim 1, further comprising:
- a source decoder electrically connected to the source lines and configured to selectively apply a source voltage to the source lines; and
- a drain decoder electrically connected to the drain lines and configured to selectively apply a drain voltage to the drain lines.

9. A semiconductor device comprising:
- a substrate; and
- one or more test circuits each including lines extending in a first direction and a second direction perpendicular to the first direction on the substrate, wherein each of the one or more test circuits comprises:
  - an array including a plurality of transistors arranged in the first and second directions, each of the transistors having a first terminal and a second terminal;
  - a first set of lines spaced apart from each other in the second direction, wherein each line of the first set of lines extends in the first direction, includes a first conductive line and a first pad disposed at one end of the first conductive line, and electrically connects to corresponding first terminals of the transistors; and
  - a second set of lines spaced apart from each other in the second direction, wherein each line of the second set of lines extends in the first direction, includes a second conductive line and a second pad disposed at one end of the second conductive line, and electrically connects to corresponding second terminals of the transistors,
  - wherein a first set of pads of the first and second sets of lines are arranged at a first side of the array and outside of the array and are configured to be electrically connected to external terminals, and
  - wherein different pads of the first set of pads are disposed at different distances from the first side of the array.

10. The semiconductor device of claim 9, wherein each of the one or more test circuits further comprises:
- a third set of lines spaced apart from each other in the first direction, wherein each line of the third set of lines extends in the second direction, includes a third conductive line and a third pad disposed at one end of the third conductive line, and electrically connects to corresponding gates of the transistors,
- wherein a second set of pads of the third set of lines are arranged at a second side of the array perpendicular to the first side of the array, and are configured to be electrically connected to external terminals, and
- wherein different pads of the second set of pads are disposed at different distances from the second side of the array.

11. The semiconductor device of claim 10, wherein each of the one or more test circuits further comprises:
- a fourth set of lines spaced apart from each other in the first direction, wherein each line of the fourth set of lines extends in the second direction, includes a fourth conductive line and a fourth pad disposed at one end of the fourth conductive line, and electrically connects to corresponding bodies of the transistors,
- wherein a third set of pads of the fourth set of lines are arranged at the second side of the array, and are configured to be electrically connected to external terminals, and
- wherein different pads of the third set of pads are disposed at different distances from the second side of the array.

12. The semiconductor device of claim 11, wherein the first set of pads are disposed in a zigzag pattern along the second direction, and
wherein the second and third sets of pads are disposed in a zigzag pattern along the first direction.

13. The semiconductor device of claim 11, wherein each of the first and second sets of lines includes a first metal formed at a first vertical level on the substrate and each of the third and fourth sets of lines includes a second metal formed at a second vertical level on the substrate higher than the first vertical level.

* * * * *